(12) United States Patent
Son et al.

(10) Patent No.: US 12,248,684 B2
(45) Date of Patent: Mar. 11, 2025

(54) NON-VOLATILE MEMORY DEVICE OPTIMIZED FOR A SURFACE MOUNT TECHNOLOGY (SMT) PROCESS AND AN OPERATING METHOD THEREOF

(71) Applicant: SAMSUNG ELECTRONICS CO., LTD., Suwon-si (KR)

(72) Inventors: Joohee Son, Hwaseong-si (KR); Hune Seo, Goyang-si (KR); Dongcheul Chang, Seongnam-si (KR); Wandong Kim, Siheung-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 146 days.

(21) Appl. No.: 18/090,658

(22) Filed: Dec. 29, 2022

(65) Prior Publication Data

US 2023/0251781 A1 Aug. 10, 2023

(30) Foreign Application Priority Data

Feb. 8, 2022 (KR) .......................... 10-2022-0016332

(51) Int. Cl.
*G06F 3/06* (2006.01)
*G11C 16/10* (2006.01)
(Continued)

(52) U.S. Cl.
CPC .......... *G06F 3/0619* (2013.01); *G06F 3/0653* (2013.01); *G06F 3/0659* (2013.01);
(Continued)

(58) Field of Classification Search
CPC .... G06F 3/0619; G06F 3/0653; G06F 3/0659; G06F 3/0679; G11C 16/102; G11C 16/20; G11C 16/26; G11C 16/3404; G11C 16/3459; G11C 11/5642; G11C 16/0483; G11C 11/5628; G11C 16/10; G11C 16/12; G11C 5/147; G11C 16/08
See application file for complete search history.

(56) References Cited

U.S. PATENT DOCUMENTS 7,764,550 B2 7/2010 Suhail et al.
8,179,717 B2 5/2012 Shepard et al.
(Continued)

FOREIGN PATENT DOCUMENTS

KR 10-2147916 8/2020

*Primary Examiner* — Mohammed A Bashar
(74) *Attorney, Agent, or Firm* — F. CHAU & ASSOCIATES, LLC

(57) ABSTRACT

An operating method of a non-volatile memory device, the method including: receiving a program command from an external device; determining an operating mode in response to the program command; when the operating mode is a surface mount technology (SMT) mode, performing an initial program operation in which a plurality of memory cells are programmed through a plurality of steps to form a first threshold voltage distribution; and when the operating mode is a normal mode, performing a normal program operation in which the plurality of memory cells are programmed through a single step to form a second threshold voltage distribution, wherein the first threshold voltage distribution is narrower in width than the second threshold voltage distribution.

18 Claims, 23 Drawing Sheets

(51) Int. Cl.
  *G11C 16/20* (2006.01)
  *G11C 16/26* (2006.01)
  *G11C 16/34* (2006.01)

(52) U.S. Cl.
  CPC .......... *G06F 3/0679* (2013.01); *G11C 16/102* (2013.01); *G11C 16/20* (2013.01); *G11C 16/26* (2013.01); *G11C 16/3404* (2013.01); *G11C 16/3459* (2013.01)

(56) References Cited

U.S. PATENT DOCUMENTS

| | | |
|---|---|---|
| 8,254,170 B2 | 8/2012 | Eli et al. |
| 9,159,405 B2 | 10/2015 | Lee |
| 9,424,933 B2 | 8/2016 | Choi et al. |
| 9,671,969 B2 | 6/2017 | Shim et al. |
| 9,798,481 B1 | 10/2017 | Shieh et al. |
| 2016/0141025 A1* | 5/2016 | Jang ........................ G11C 16/12 365/185.03 |
| 2016/0240257 A1* | 8/2016 | Kwak .................... G11C 16/10 |
| 2017/0068481 A1* | 3/2017 | Yoo ........................ G06F 3/0611 |
| 2021/0097010 A1 | 4/2021 | Kim et al. |

\* cited by examiner

FIG. 10

|  | First pre-program | | | | Second pre-program | | | |
|---|---|---|---|---|---|---|---|---|
|  | SSL0 | SSL1 | SSL2 | SSL3 | SSL0 | SSL1 | SSL2 | SSL3 |
| WL8 | 1-1 | 1-2 | 1-3 | 1-4 | 3-1 | 3-2 | 3-3 | 3-4 |
| WL7 | 2-1 | 2-2 | 2-3 | 2-4 | 5-1 | 5-2 | 5-3 | 5-4 |
| WL6 | 4-1 | 4-2 | 4-3 | 4-4 | 7-1 | 7-2 | 7-3 | 7-4 |
| WL5 | 6-1 | 6-2 | 6-3 | 6-4 | 9-1 | 9-2 | 9-3 | 9-4 |
| WL4 | 8-1 | 8-2 | 8-3 | 8-4 | 11-1 | 11-2 | 11-3 | 11-4 |
| WL3 | 10-1 | 10-2 | 10-3 | 10-4 | 13-1 | 13-2 | 13-3 | 13-4 |
| WL2 | 12-1 | 12-2 | 12-3 | 12-4 | 15-1 | 15-2 | 15-3 | 15-4 |
| WL1 | 14-1 | 14-2 | 14-3 | 14-4 | 16-1 | 16-2 | 16-3 | 16-4 |

FIG. 18A

|  | Flag |
|---|---|
| Initial State | 0 |
| Pre-PGM | 1 |
| SMT | 1 |
| Migration | 0 |

FIG. 18B

|  | 1st bit | 2nd bit |
|---|---|---|
| Initial State | 0 | 0 |
| Pre-PGM | 1 | 0 |
| SMT | 1 | 0 |
| Migration | 1 | 1 |

NON-VOLATILE MEMORY DEVICE OPTIMIZED FOR A SURFACE MOUNT TECHNOLOGY (SMT) PROCESS AND AN OPERATING METHOD THEREOF

CROSS-REFERENCE TO RELATED APPLICATION

This application claims priority under 35 U.S.C. § 119 to Korean Patent Application No. 10-2022-0016332 filed on Feb. 8, 2022, in the Korean Intellectual Property Office, the disclosure of which is incorporated by reference herein in its entirety.

TECHNICAL FIELD

Embodiments of the present disclosure described herein relate to a non-volatile memory device, and more particularly, to a non-volatile memory device for performing different program operations before and after a surface mount technology (SMT) process so as to be optimized for the SMT process and an operating method thereof.

DISCUSSION OF RELATED ART

A semiconductor memory device may be classified as a volatile semiconductor memory device or a non-volatile semiconductor memory device. The volatile semiconductor memory device has fast read and write speeds but loses data stored therein in the absence of power. In contrast, the non-volatile semiconductor memory device retains data stored therein even in the absence of power. Accordingly, the non-volatile semiconductor memory device is used to store information that has to be retained in an un-powered state.

A flash memory device is an example of the non-volatile semiconductor memory device. The flash memory device has a variety of applications and, for example, is being widely used as voice and image data storage media of information devices (hereinafter referred to as "hosts") such as a computer, a mobile phone, a personal digital assistant (PDA), a digital camera, a camcorder, a voice recorder, an MP3 player, a handheld personal computer (PC), a game console, a facsimile, a scanner, and a printer.

As another example, a NAND flash memory is now being used as a data storage medium of an automotive electronic device. The flash memory of the automotive electronic device stores operating system (OS) data, is mounted on a printed circuit board, and is then shipped. The OS data may be stored in the flash memory before the flash memory is mounted on the printed circuit board of the automotive electronic device. The process of mounting the flash memory on the printed circuit board of the automotive electronic device involves a high-temperature surface mount technology (SMT) or infrared (IR) reflow. In this case, a threshold voltage distribution of memory cells may vary due to the high-temperature process, thereby reducing the reliability of the OS data stored in the flash memory.

SUMMARY

Embodiments of the present disclosure provide a non-volatile memory device capable of maintaining the reliability of data stored in memory cells in a high-temperature surface mount technology (SMT) process and an operating method thereof.

According to an embodiment of the present disclosure, there is provided an operating method of a non-volatile memory device, the method including: receiving a program command from an external device; determining an operating mode in response to the program command; when the operating mode is an SMT mode, performing an initial program operation in which a plurality of memory cells are programmed through a plurality of steps to form a first threshold voltage distribution; and when the operating mode is a normal mode, performing a normal program operation in which the plurality of memory cells are programmed through a single step to form a second threshold voltage distribution, wherein the first threshold voltage distribution is narrower in width than the second threshold voltage distribution.

According to an embodiment of the present disclosure, there is provided an operating method of a non-volatile memory device, the method including: receiving a read command from an external device; determining an operating mode in response to the read command; when the operating mode is an SMT mode, performing a first read operation based on a first read level set; and when the operating mode is a normal mode, performing a second read operation based on a second read level set, wherein the first read level set is used to read a first threshold voltage distribution of memory cells programmed in the SMT mode, wherein the second read level set is used to read a second threshold voltage distribution of memory cells programmed in the normal mode, wherein the first threshold voltage distribution is narrower in width than the second threshold voltage distribution.

According to an embodiment of the present disclosure, there is provided an operating method of a non-volatile memory device, the method including: performing an initial program operation in which a plurality of memory cells are programmed based on a program command through a plurality steps to form a first threshold voltage distribution, in an SMT mode; performing a first read operation which data programmed in the plurality of memory cells after a surface mount technology is applied are read based on a first read level set, in the SMT mode; performing a normal program operation in which the plurality of memory cells on which the first read operation is completely performed are programmed based on the program command to form a second threshold voltage distribution, in a normal mode; and performing a second read operation in which data programmed in the plurality of memory cells are read based on a second read level set different from the first read level set, in the normal mode, wherein the first threshold voltage distribution is narrower in width than the second threshold voltage distribution.

BRIEF DESCRIPTION OF THE FIGURES

The above and other features of the present disclosure will become apparent by describing in detail embodiments thereof with reference to the accompanying drawings.

FIG. 10 is a diagram for describing an order of initial program operations of FIG. 6A.

FIGS. 18A and 18B illustrate examples of flags marked according to operation S431 of FIG. 17.

DETAILED DESCRIPTION OF THE EMBODIMENTS

Below, embodiments of the present disclosure will be described in detail and clearly to such an extent that one skilled in the art can easily carry out the present disclosure.

Figure 1:
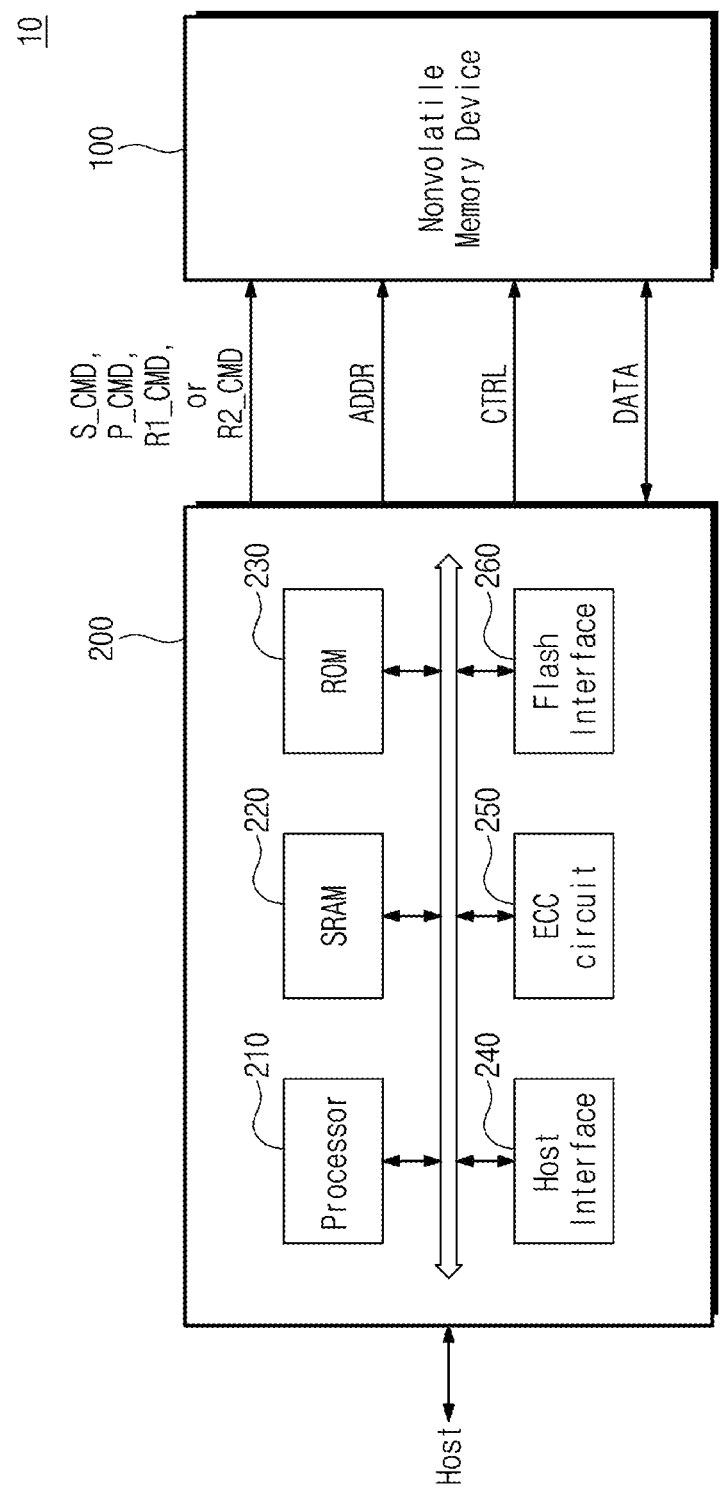
FIG. 1 is a block diagram illustrating a memory system according to an embodiment of the present disclosure.

FIG. 1 is a block diagram illustrating a memory system according to an embodiment of the present disclosure. Referring to FIG. 1, a memory system 10 may include a non-volatile memory device 100 and a memory controller 200. Each of the non-volatile memory device 100 and the memory controller 200 may be implemented with one chip, one package, or one module. Alternatively, the non-volatile memory device 100 and the memory controller 200 may be implemented with one chip, one package, or one module so as to constitute a memory system such as a memory card, a memory stick, or a solid state drive (SSD).

The non-volatile memory device 100 may receive a command CMD from the memory controller 200. According to an embodiment, the non-volatile memory device 100 may receive a program command P_CMD to perform a program operation. The program operation may include an initial program operation and a normal program operation.

The initial program operation may refer to a program operation that the non-volatile memory device 100 performs in response to the program command P_CMD in a surface mount technology (SMT) mode, and the normal program operation may refer to a program operation that the non-volatile memory device 100 performs in response to the program command P_CMD in a normal mode. The non-volatile memory device 100 may be set to the SMT mode or the normal mode depending on a set feature command S_CMD.

The SMT mode may be a program mode before the non-volatile memory device 100 experiences the SMT process. In the SMT mode, the non-volatile memory device 100 may perform the initial program operation and a first read operation. The normal mode may be a program mode after the non-volatile memory device 100 experiences the SMT process. In the normal mode, the non-volatile memory device 100 may perform the normal program operation and a second read operation. For example, the SMT process may be used to mount the non-volatile memory device 100, in which basic data, raw data, or default data (e.g., operating system (OS) data) are stored in advance, on a printed circuit board.

In other words, the initial program operation may refer to an operation for programming the default data before the SMT process, and the normal program operation may refer to an operation for programming user data after the SMT process. A width (or range) of a threshold voltage distribution of memory cells formed by the initial program operation may be narrower than a width (or range) of a threshold voltage distribution of the memory cells formed by the normal program operation. In other words, a read margin (e.g., a threshold voltage margin) of program states formed by the initial program operation may be greater than that formed by the normal program operation.

According to an embodiment, the non-volatile memory device 100 may receive a first read command R1_CMD and a second read command R2_CMD from the memory controller 200 and may perform a read operation corresponding to each of the first and second read commands R1_CMD and R2_CMD. The non-volatile memory device 100 may perform the first read operation in response to the first read command R1_CMD. The non-volatile memory device 100 may perform the second read operation in response to the second read command R2_CMD.

The first read operation may be an operation of reading data stored in memory cells after the initial program operation is performed. The second read operation may be an operation of reading data stored in memory cells after the normal program operation is performed. Because a threshold voltage distribution of memory cells formed by the initial program operation is different from a threshold voltage distribution of the memory cells formed by the normal program operation, a read voltage or a read time of the first read operation may be different from a read voltage or a read time of the second read operation.

Since the non-volatile memory device 100 according to the present disclosure performs different program operations before and after the SMT process and differently controls a read voltage or a read time depending on each program operation, the non-volatile memory device 100 may perform the program operation optimized for the SMT process. In other words, the non-volatile memory device 100 may increase the reliability of data by performing the program operation and the read operation optimized for the SMT process.

The non-volatile memory device 100 according to an embodiment of the present disclosure and an operating method of the non-volatile memory device 100 will be described with reference to the following drawings.

The memory controller 200 may be configured to control the non-volatile memory device 100. The memory controller 200 may send an address ADDR, the command CMD, and a control signal CTRL to the non-volatile memory device 100 to write data "DATA" in the non-volatile memory device 100 or read the data "DATA" from the non-volatile memory device 100.

According to an embodiment, the memory controller 200 may send the set feature command S_CMD, the program command P_CMD, the first read command R1_CMD, or the second read command R2_CMD to the non-volatile memory device 100 based on a request of a host. The non-volatile memory device 100 may set the SMT mode or the normal mode in response to the set feature command S_CMD. For example, when the set feature command S_CMD has a first value, the non-volatile memory device 100 may be to the SMT mode and when the set feature command S_CMD has a second value different from the first value, the non-volatile memory device 100 may be set to the normal mode. The non-volatile memory device 100 may perform the initial program operation or the normal program operation in response to the program command P_CMD. For example, in the SMT mode, the non-volatile memory device 100 may perform the initial program operation in response to the program command P_CMD; and in the normal mode, the non-volatile memory device 100 may perform the normal program operation in response to the program command P_CMD. The non-volatile memory device 100 may perform the first read operation in response to the first read command R1_CMD. The non-volatile memory device 100 may perform the second read operation in response to the second read command R2_CMD.

The memory controller 200 may include a processor 210, a static random access memory (SRAM) 220, a read only memory (ROM) 230, a host interface 240, an error correction code (ECC) circuit 250, and a flash interface 260. The processor 210 may control an overall operation of the memory controller 200. The processor 210 may execute firmware for driving the memory controller 200. The firmware may be loaded and executed onto the SRAM 220.

Software or firmware for controlling the memory controller 200 may be loaded onto the SRAM 220. For example, a flash translation layer (FTL) may be loaded onto the SRAM 220. The SRAM 220 may be used as a buffer memory, a cache memory, or a working memory of the memory controller 200.

According to an embodiment, flag information may be stored in the SRAM 220. The flag information may include information about whether a program operation associated with a memory block is completed. The processor 210 may set a flag corresponding to a corresponding memory block when the program operation associated with the corresponding memory block is completed. For example, when the initial program operation is completed, the processor 210 may set flag "1" to a target memory block. For example, when the normal program operation is completed, the processor 210 may set flag "0" to the target memory block. The processor 210 may provide the first read command R1_CMD or the second read command. R2_CMD to the non-volatile memory device 100 with reference to the set flag. The flag information will be described in detail with reference to FIGS. 18A and 18B.

The ROM 230 may store a variety of information, which is necessary for the memory controller 200 to operate, in the form of firmware. For example, code data, or the like, for performing an interface with the flash translation layer or the host may be stored in the ROM 230.

The host interface 240 may provide an interface between the host and the memory controller 200. The memory controller 200 may communicate with an external device (e.g., a host or an application processor) through the host interface 240. For example, the host interface 240 may include at least one of various interfaces such as universal serial bus (USB), multimedia card (MMC), embedded MMC (eMMC), peripheral component interconnection (PCI), PCI-express (PCI-e), advanced technology attachment (ATA), serial-ATA, parallel-ATA, small computer small interface (SCSI), enhanced small disk interface (ESDI), integrated drive electronics (IDE), Firewire, and universal flash storage (UFS).

The ECC circuit 250 may detect an error of data read from the non-volatile memory device 100 and may correct the detected error. By using the number of error bits of the read data that the ECC circuit 250 detects, the memory controller 200 may output a read failure signal that is associated with a memory block in which the read data are included, or a portion of the memory block.

The memory controller 200 may communicate with the non-volatile memory device 100 through the flash interface 260. For example, the flash interface 260 may include a NAND interface.

Figure 2:
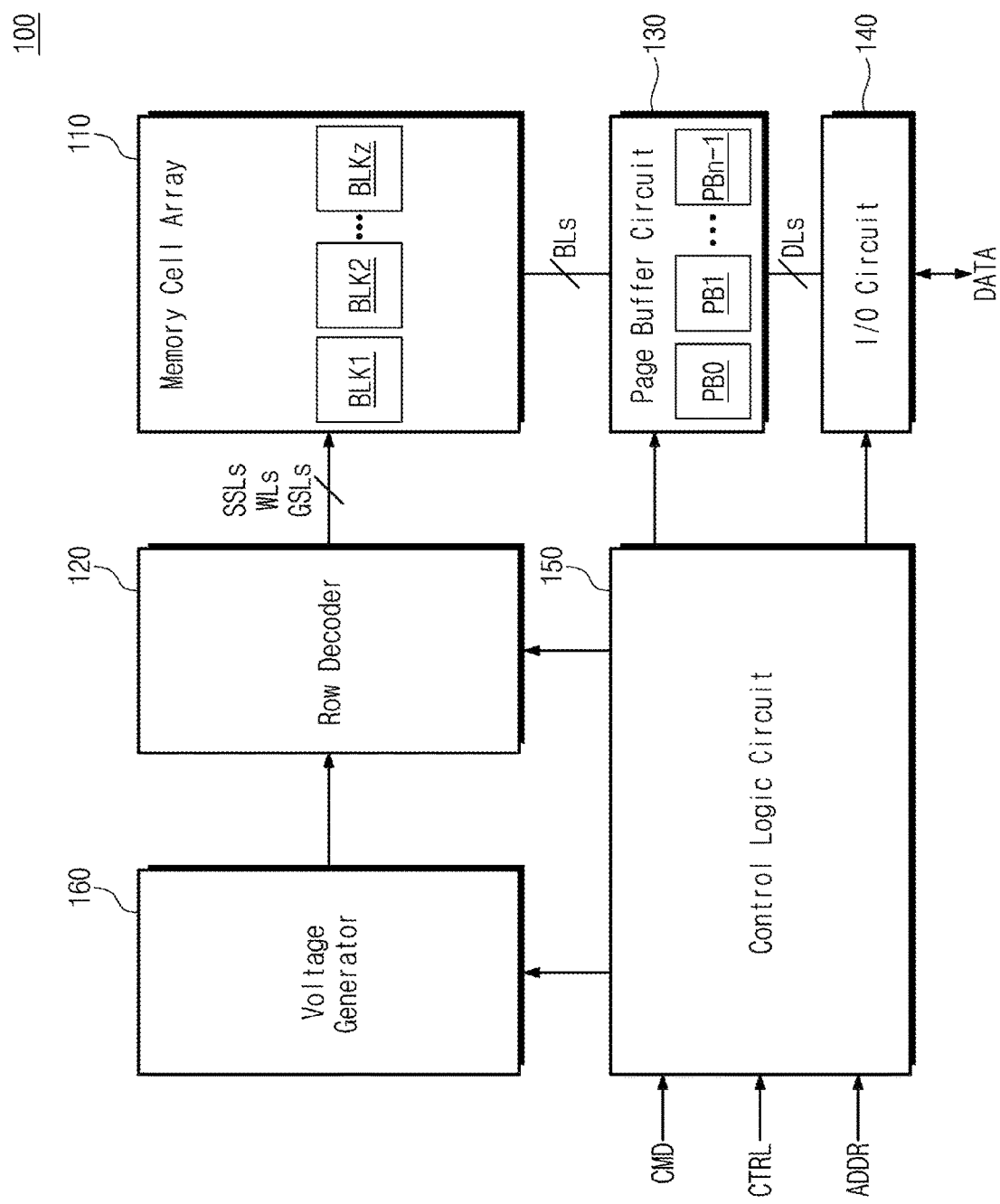
FIG. 2 is a block diagram illustrating a non-volatile memory device of FIG. 1.

FIG. 2 is a block diagram illustrating a non-volatile memory device of FIG. 1. Referring to FIGS. 1 and 2, the non-volatile memory device 100 may include a memory cell array 110, a row decoder 120, a page buffer circuit 130, an input/output (I/O) circuit 140, a control logic circuit 150, and a voltage generator 160.

The memory cell array 110 may include a plurality of memory cells that are respectively disposed at intersections of a plurality of word lines WLs and a plurality of bit lines BLs. The plurality of memory cells may constitute a plurality of memory blocks BLK1, BLK2, and BLKz. The plurality of memory cells may be connected with the plurality of word lines WLs, respectively, and the memory cell array 110 may be connected with the row decoder 120 through the plurality of word lines WLs. Each memory cell may be a single level cell (SLC) for storing one bit data or a multi-level cell (MLC) storing at least two bits of data. In the specification, below, for convenience of description, it is assumed that each of the memory cells is a triple level cell (TLC) for storing 3-bit data, but the present disclosure is not limited thereto.

The row decoder 120 may be connected with the memory cell array 110 through a plurality of string selection lines SSLs, the plurality of word lines WLs, and a plurality of ground selection lines GSLs. The row decoder 120 may operate under control of the control logic circuit 150. The row decoder 120 may decode the address ADDR under control of the control logic circuit 150. An example in which the control logic circuit 150 receives the address ADDR is illustrated in FIG. 2, but the present disclosure is not limited thereto. For example, the row decoder 120 may receive the address ADDR from the memory controller 200.

The row decoder 120 may control the plurality of string selection lines SSLs, the plurality of word lines WLs, and the plurality of ground selection lines GSLs based on a decoding result. For example, the row decoder 120 may select at one and more word lines of the plurality of word lines WLs based on a control signal of the control logic circuit 150. In the specification, below, the one or more word lines selected by the row decoder 120 may be referred to as a "selection word line".

The page buffer circuit 130 may be connected with the memory cell array 110 through the plurality of bit lines BLs. The page buffer circuit 130 may store data in the memory cell array 110 by controlling the bit lines BLs. The page buffer circuit 130 may read data stored in the memory cell array 110 by sensing voltages of the bit lines BLs.

The page buffer circuit 130 may include a plurality of page buffers PB0, PB1, . . . , PBn-1 respectively connected with the bit lines BLs. For example, the page buffer PB0 may be connected with the bit line BL0, and may include a plurality of latches that latch voltage levels of a sensing node under different conditions and store the latched voltage levels. This will be described in detail with reference to FIG. 13.

The page buffer circuit 130 may output the read data to the input/output circuit 140. For example, the page buffer circuit 130 may receive data from the input/output circuit 140 in units of page or may read data from the memory cell array 110 in units of page.

The page buffer circuit 130 may temporarily store data read from the memory cell array 110 or data to be stored in the memory cell array 110. For example, when a verify read operation associated with an erase operation or a program operation is performed on memory cells connected with a selection word line, the page buffer circuit 130 may sense voltages of the bit lines BLs and may store a sensing result.

The input/output circuit 140 may be connected with the page buffer circuit 130 through a plurality of data lines DLs. The input/output circuit 140 may output the data read by the page buffer circuit 130 to the memory controller 200 over an output channel and may provide data received from the memory controller 200 over an input channel to the page buffer circuit 130.

The control logic circuit 150 may receive at least one of various types of commands CMD (e.g., the set feature command S_CMD, the program command P_CMD, the first read command R1_CMD, and the second read command R2_CMD), the control signal CTRL, and the address ADDR from the memory controller 200. The control logic circuit 150 may control at least one of the row decoder 120, the page buffer circuit 130, the input/output circuit 140, and the voltage generator 160 in response to a signal received from the memory controller 200.

The control logic circuit 150 may control the initial program operation or the normal program operation for the memory cell array 110 in response to the program command P_CMD. The control logic circuit 150 may control the row decoder 120 such that word lines are selected.

The control logic circuit 150 may control the voltage generator 160 such that a setting voltage is applied to a selection word line(s). The control logic circuit 150 may control the first read operation or the second read operation for the memory cell array 110 in response to a read command (e.g., the first read command R1_CMD or the second read command R2_CMD).

According to an embodiment, the control logic circuit 150 may include a count circuit. The count circuit may count memory cells belonging to a specific threshold voltage range from a sensing result stored in the page buffer circuit 130.

The voltage generator 160 may generate voltages for performing an erase operation, the program operation (e.g., the initial program operation or the normal program operation), and the read operation (e.g., the first read operation or the second read operation) with respect to the memory cell array 110. For example, the voltage generator 160 may generate a power supply voltage, an erase voltage, a program voltage, a read voltage, a pass voltage, an erase verify voltage, a program verify voltage, or the like. In addition, the voltage generator 160 may generate a string selection line voltage and a ground selection line voltage.

The setting voltage generated by the voltage generator 160 may be applied to the selection word line through the row decoder 120 based on the control signal of the control logic circuit 150. The voltage generator 160 may differently generate the setting voltage depending on the erase operation or the program operation. The voltage generator 160 may differently generate the setting voltage in the order of the erase operation and the program operation.

Figure 3:
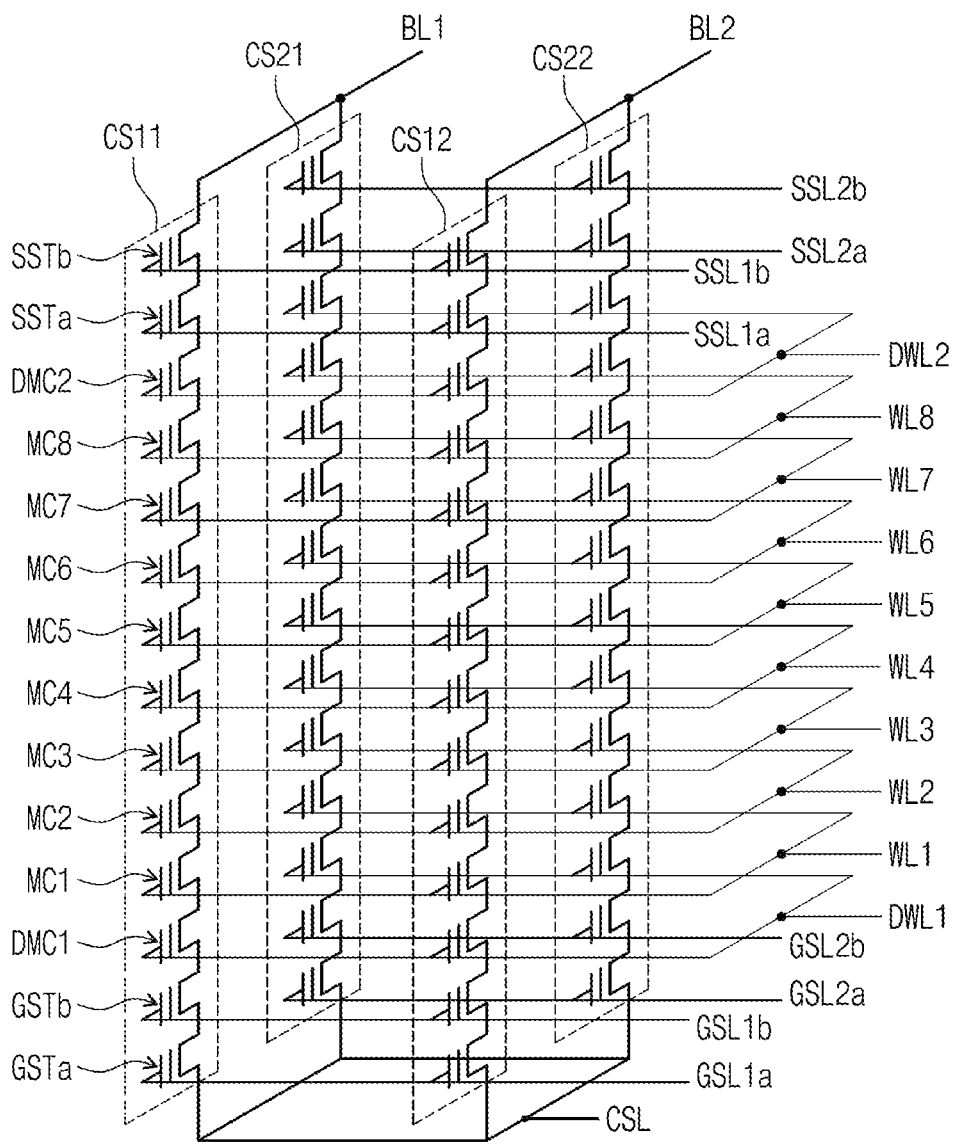
FIG. 3 is a circuit diagram illustrating a memory block included in a memory cell array of FIG. 2.
Figure 3:
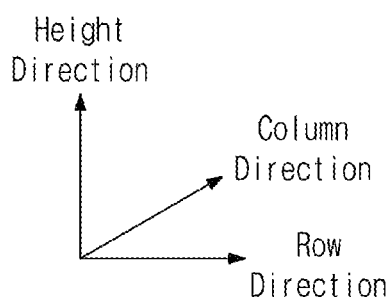

FIG. 3 is a circuit diagram illustrating a memory block included in a memory cell array of FIG. 2. For brevity of drawing and for convenience of description, one memory block BLK1 is illustrated as an example, but the present disclosure is not limited thereto. For example, the remaining memory blocks may be similar in structure to the memory block BLK1 of FIG. 3.

Referring to FIGS. 2 and 3, the first memory block BLK1 may include a plurality of cell strings CS11, CS12, CS21, and CS22. The plurality of cell strings CS11, CS12, CS21, and CS22 may be arranged in a row direction and a column direction. For brevity of description, the four cell strings CS11 CS12, CS21, and CS22 are illustrated in FIG. 3, but the present disclosure is not limited thereto. For example, the number of cell strings may increase or decrease in the row direction or the column direction.

Cell strings placed at the same column from among the plurality of cell strings CS11, CS12, CS21, and CS22 may be connected with the same bit line. For example, the cell strings CS11 and CS21 may be connected with a first bit line BL1, and the cell strings CS12 and CS22 may be connected with a second bit line BL2. Each of the plurality of cell strings CS11, CS12, CS21, and CS22 may include a plurality of cell transistors. Each of the plurality of cell transistors may be implemented with a charge trap flash (CTF) memory cell. The plurality of cell transistors may be stacked in a height direction that is a direction perpendicular to a plane (e.g., a semiconductor substrate) formed by the row direction and the column direction.

The plurality of cell transistors may be connected in series between the corresponding bit line (e.g., BL1 or BL2) and a common source line CSL. For example, the plurality of cell transistors may include string selection transistors SSTa and SSTb, dummy memory cells DMC1 and DMC2, memory cells MC1, MC2, MC3, MC4, MC5, MC6, MC7 and MC8, and ground selection transistors GSTa and GSTb. The serially-connected string selection transistors SSTa and SSTb may be provided between the serially-connected memory cells MC1 to MC8 and the corresponding bit line (e.g., BL1 and BL2). The serially-connected ground selection transistors GSTa and GSTb may be provided between the serially-connected memory cells MC1 to MC8 and the common source line CSL. According to an embodiment, the second dummy memory cell DMC2 may be provided between the serially-connected string selection transistors SSTa and SSTb and the serially-connected memory cells MC1 to MC8, and the first dummy memory cell DMC1 may be provided between the serially-connected memory cells MC1 to MC8 and the serially-connected ground selection transistors GSTa and GSTb.

Memory cells placed at the same height from among the memory cells MC1 to MC8 of the plurality of cell strings CS11, CS12, CS21, and CS22 may share the same word line. For example, the first memory cells MC1 of the plurality of cell strings CS11, CS12, CS21, and CS22 may be placed at the same height from the semiconductor substrate and may share a first word line WL1. The second memory cells MC2 of the plurality of cell strings CS11, CS12, CS21, and CS22 may be placed at the same height from the semiconductor substrate and may share a second word line WL2. Likewise, the third memory cells MC3 of the plurality of cell strings CS11, CS12, CS21, and CS22 may be placed at the same height from the substrate and may share a third word line WL3, and the fourth memory cells MC4 of the plurality of cell strings CS11, CS12, CS21, and CS22 may be placed at the same height from the substrate (not illustrated) and may share a fourth word line WL4. The remaining memory cells MC5, MC6, MC7 and MC8 of the plurality of cell strings CS11, CS12, CS21, and CS22 may respectively share a fifth word line WL5, a sixth word line WL6, a seventh word line WL7 and an eighth word line WL8.

Dummy memory cells placed at the same height from among the dummy memory cells DMC1 and DMC2 of the plurality of cell strings CS11, CS12, CS21, and CS22 may share the same dummy word line. For example, the first dummy memory cells DMC1 of the plurality of cell strings CS11, CS12, CS21, and CS22 may share a first dummy word line DWL1, and the second dummy memory cells DMC2 of the plurality of cell strings CS11, CS12, CS21, and CS22 may share a second dummy word line DWL2.

In the plurality of cell strings CS11, CS12, CS21, and CS22, string selection transistors placed at the same height and the same row from among the string selection transistor SSTa or SSTb of the plurality of cell strings CS11, CS12, CS21, and CS22 may be connected with the same string selection line. For example, the string selection transistors SSTb of the cell strings CS11 and CS12 may be connected with a string selection line SSL1b, and the string selection transistors SSTa of the cell strings CS11 and CS12 may be connected with a string selection line SSL1a. The string selection transistors SSTb of the cell strings CS21 and CS22 may be connected with a string selection line SSL2b, and the string selection transistors SSTa of the cell strings CS21 and CS22 may be connected with a string selection line SSL2a.

In the plurality of cell strings CS11, CS12, CS21, and CS22, ground selection transistors positioned at the same height and the same row from among the ground selection transistors GST1b and GST1a may share the same string selection line. For example, the ground selection transistors GSTb of the cell strings CS11 and CS12 may be connected with a ground selection line GSL1b, and the ground selection transistors GSTa of the cell strings CS11 and CS12 may be connected with a ground selection line GSL1a. The ground selection transistors GSTb of the cell strings CS21 and CS22 may be connected with a ground selection line GSL2b, and the ground selection transistors GSTa of the cell strings CS21 and CS22 may be connected with a ground selection line GSL2a.

The first memory block BLK1 illustrated in FIG. 3 is an example. The number of cell strings may increase or decrease, and the number of rows of cell strings and the number of columns of cell strings may increase or decrease depending on the number of cell strings. In addition, in the first memory block BLK1, the number of cell transistors may increase or decrease, and the height of the first memory block BLK1 may increase or decrease depending on the number of cell transistors. In addition, the number of lines connected with cell transistors may increase or decrease depending on the number of cell transistors.

Figure 4:
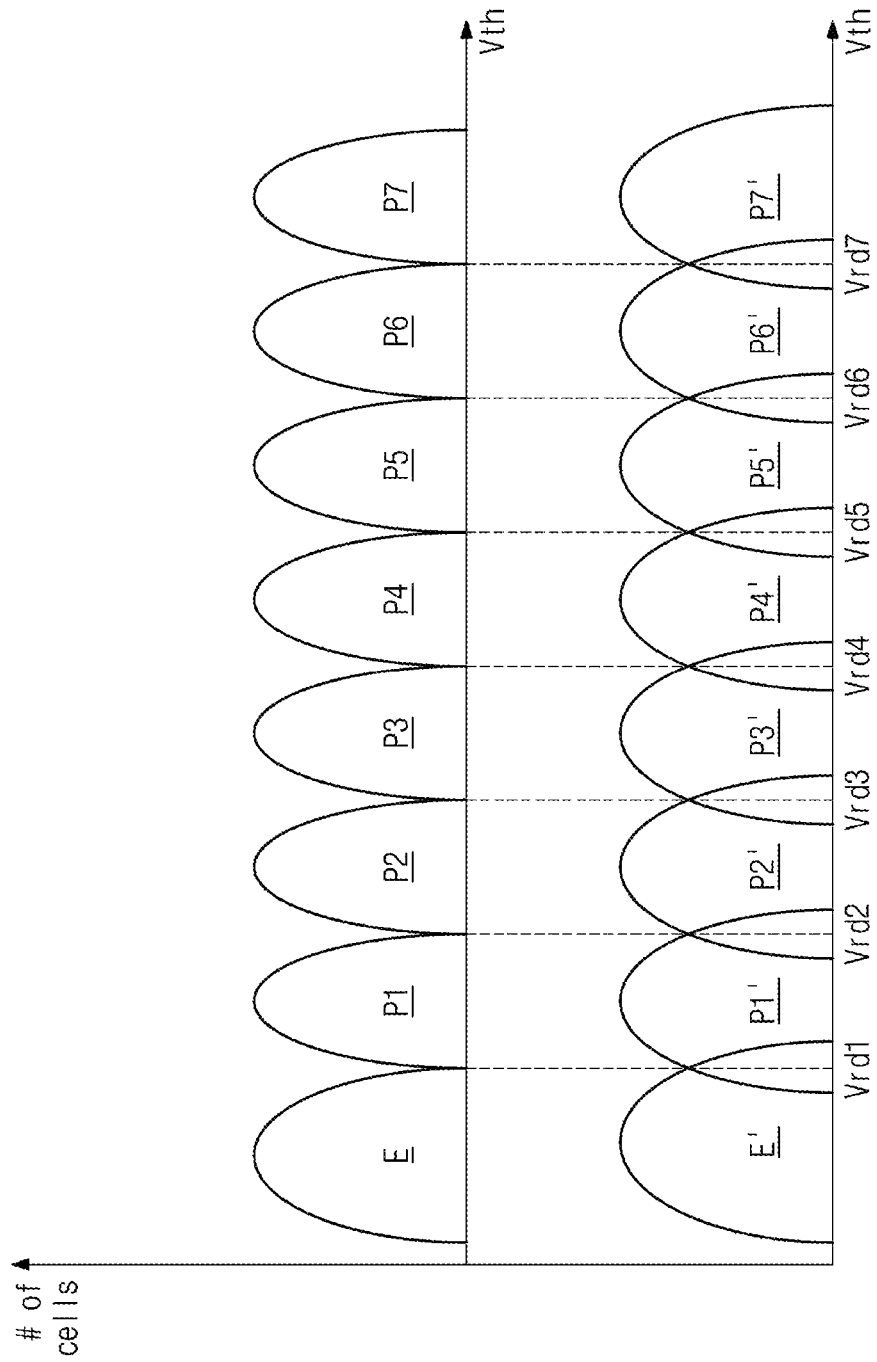
FIG. 4 is a distribution diagram of memory cells included in a memory cell array of FIG. 2.

FIG. 4 is a distribution diagram of memory cells included in a memory cell array of FIG. 2. In FIG. 4, a horizontal axis represents a threshold voltage Vth, and a vertical axis represents the number of memory cells. Referring to FIGS. 2 and 4, in the case of a TLC memory device in which one memory cell stores 3-bit data, one memory cell may have one of eight threshold voltages. However, threshold voltages of a plurality of memory cells programmed with the same data may form a threshold voltage distribution of a given range due to an electrical characteristic difference of the plurality of memory cells.

In the case of the TLC, threshold voltage distributions respectively corresponding to one erase state "E" and 7 program states P1, P2, P3, P4, P5, P6 and P7 are formed. According to an embodiment, the above distributions may be distributions immediately after a 1-step initial program operation is completed. In this case, the threshold voltage distributions may be ideally formed. In other words, the threshold voltage distributions respectively corresponding to the states "E" and P1 to P7 may not overlap each other. As such, read voltages Vrd1, Vrd2, Vrd3, Vrd4, Vrd5, Vrd6 and Vrd7 may be used to distinguish the threshold voltage distributions.

Elections stored in memory cells may be discharged due to degradation resulting from a high temperature. In this case, the threshold voltage distributions may move to the left or the right. For example, in the case of the SMT process, memory cells may experience a high-temperature environment of about 260 degrees. In this case, threshold voltage distributions corresponding to an erase state E' and 7 program states P1', P2', P3', P4', P5', P6' and P7' may overlap each other. For example, the program states P1' and P2' may overlap each other and the program states P2' and P3' may overlap each other.

In the case where a read voltage is applied to a selection word line, with the threshold voltage distributions overlapping each other, an uncorrectable error correction code (UECC) may occur due to error bits, the number of which exceeds a given level. For example, that a memory cell is determined as an on cell upon applying the first read voltage Vrd1 may mean that the memory cell is in the erase state E', and that the memory cell is determined as an off cell upon applying the first read voltage Vrd1 may mean that the memory cell is in the first program state P1'. In other words, in the case where threshold voltage distributions overlap each other, a specific memory cell may be determined as an off cell even though the specific memory cell is in the erase state E'. In addition, the specific memory cell may be determined as an on cell even through the cell is in the first program state P1'. In this case, a ratio at which error bits occur in a non-volatile memory device may increase.

Figure 5:
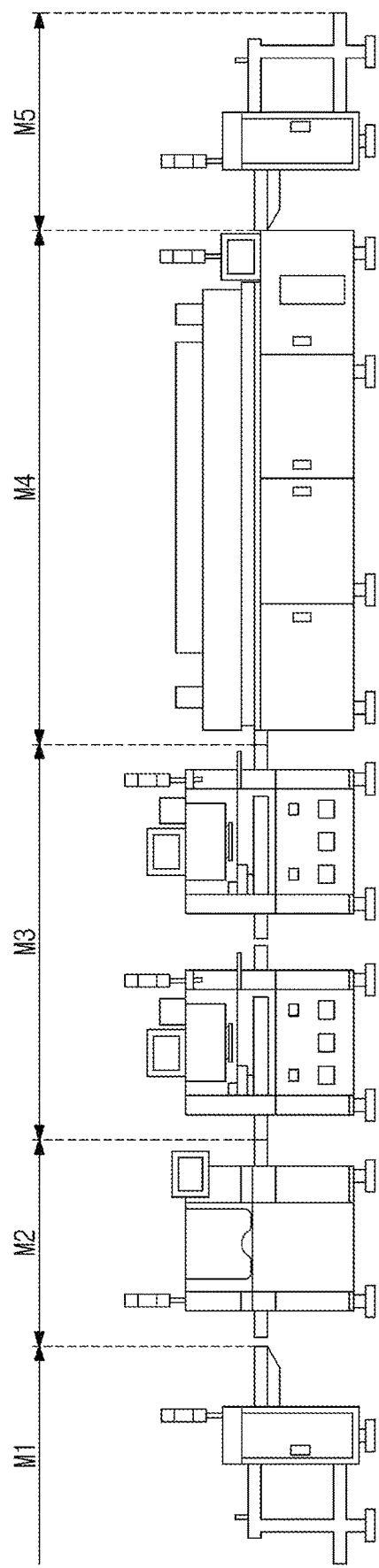
FIG. 5 is a diagram illustrating an example of a surface mount technology (SMT) process.

FIG. 5 is a diagram illustrating an example of an SMT process. Referring to FIG. 5, the SMT process may include a loading step M1, a printing step M2, a placement step M3, a soldering step M4, and an unloading step M5.

According to the SMT process, 1) a solder paste is printed on a printed circuit board (PCB), 2) various types of surface mount devices (SMD) are mounted on the printed circuit board by using a pick and place machine referred to as a mounter, and 3) the printed circuit board is passed through a reflow oven in which the solder paste gets melted and forms joints between the printed circuit board and its components. The SMT process may refer to a technology for producing the printed circuit board (PCB) finished by a combination of a plurality of machines. At least one SMT process line including a plurality of machines may be provided depending on a work environment.

The loading step M1 may include loading the PCB onto an SMT machine area. For example, the loader is a machine for automatically supplying the PCB and may supply a substrate by using a medium called a magazine.

The printing step M2 may include printing a solder on a pattern area of the PCB on which a plurality of devices are to be mounted. For example, a printing inspection machine may print the solder at component-mounted locations on the PCB supplied through the loader.

The placement step M3 may include mounting a plurality of devices on the solder. For example, a chip mounter may place and fix various types of components and chips on the land of the PCB on which the solder is printed. According to an embodiment, the chip mounter may be provided in plural.

The soldering step M4 may include reflowing the solder. For example, the reflow oven may heat and melt the solder paste under the components mounted on the PCB, and then, may fix the components on the PCB through a hardening process. According to an embodiment, the reflow oven may heat the solder at a high temperature of 260 degrees for 30 seconds.

The unloading step M5 may include unloading the PCB, on which a plurality of devices are coupled, to the outside of the SMT machine area. For example, an unloader may convey the PCB, on which a plurality of devices are coupled, to the outside of the SMT process line. According to an embodiment, the unloader may include an inspection system that compares an image of a hardened PCB and a stored reference image and determines whether the finished PCB is defective.

According to an embodiment, the non-volatile memory device 100 may be mounted on the PCB through the SMT process. In this case, the non-volatile memory device 100 may be exposed to a high-temperature environment and may experience high-temperature degradation. In other words, as the non-volatile memory device 100 is passed through the SMT process line, the non-volatile memory device 100 may end up having the threshold voltage distribution diagram corresponding to the erase state E' and the seven program states P1' to P7 of FIG. 4. In other words, a probability of occurrence of error bits may increase.

The non-volatile memory device 100 according to an embodiment of the present disclosure may perform different program operations before and after the SMT process for the purpose of minimizing error bits and increasing the reliability of data.

Figure 6A:
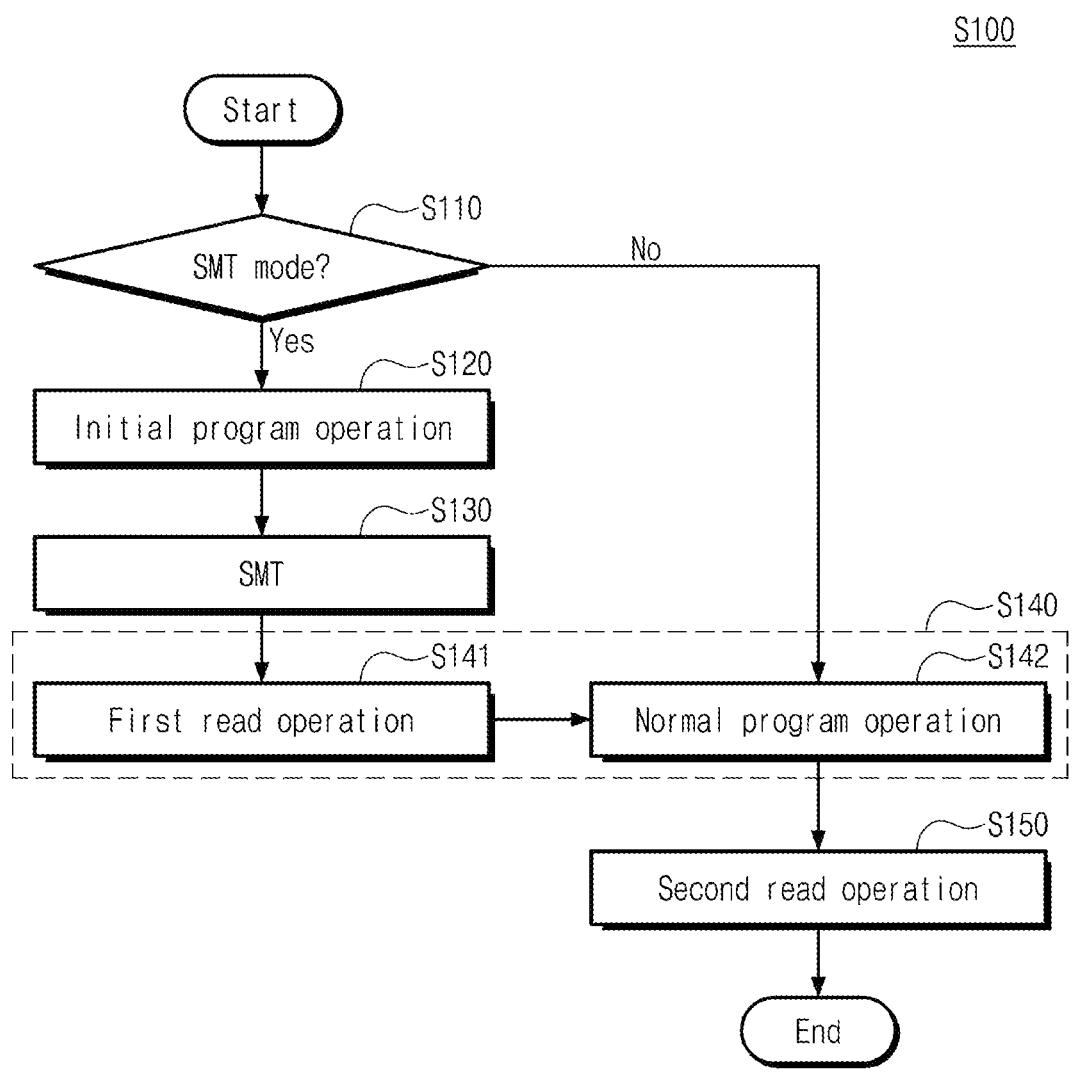
FIGS. 6A, 6B and 6C are flowcharts illustrating an operating method of a non-volatile memory device according to an embodiment of the present disclosure.
Figure 6B:
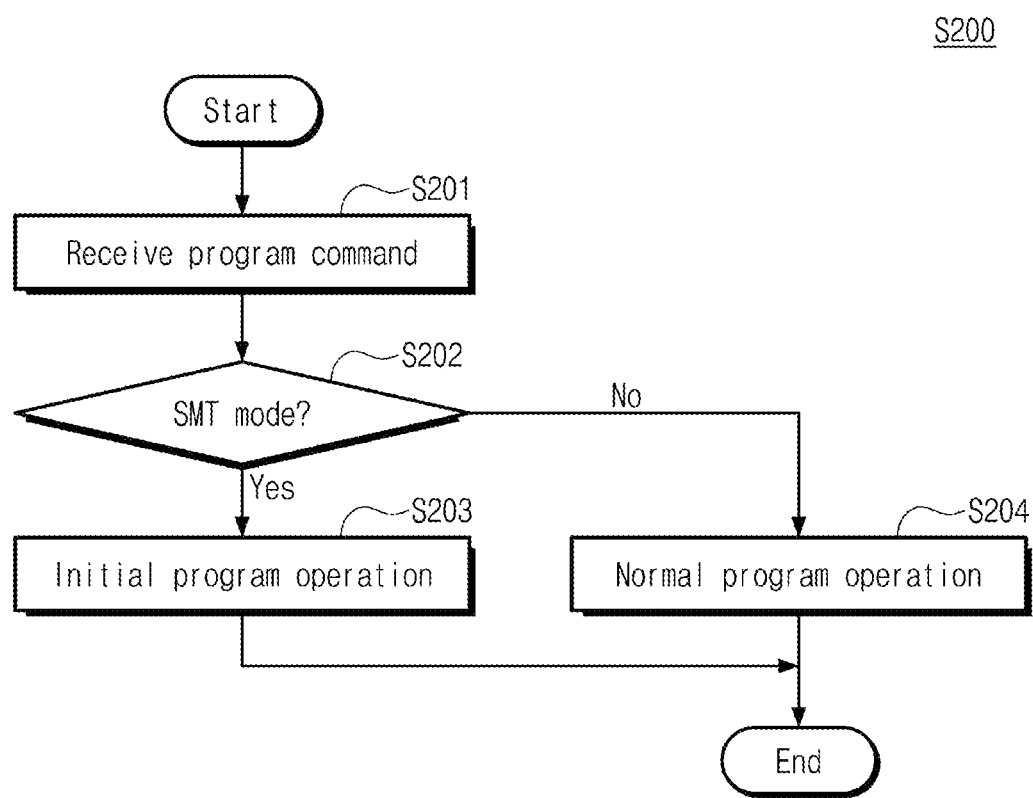
Figure 6C:
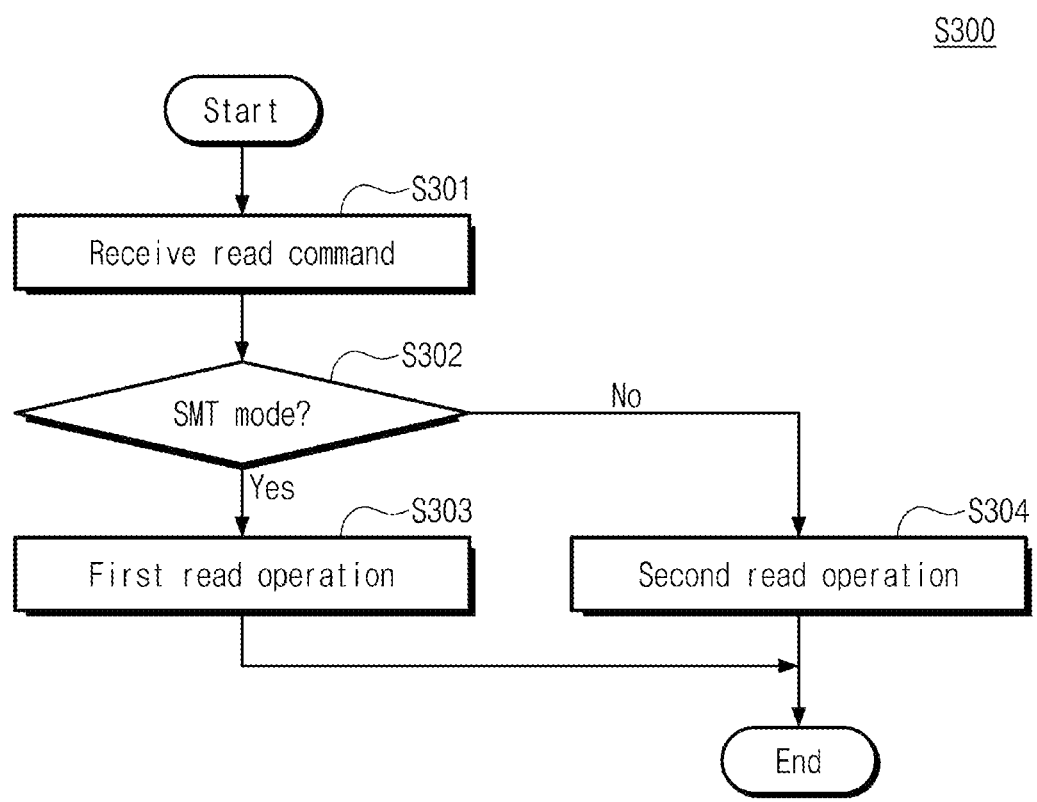

FIGS. 6A to FIG. 6C are flowcharts illustrating an operating method of a non-volatile memory device according to the present disclosure. Referring to FIGS. 1, 2, and 6A, an operating method S100 of the non-volatile memory device 100 may be performed under control of the memory controller 200. The memory controller 200 may control the non-volatile memory device 100 such that different program operations are performed before and after the SMT process, and the non-volatile memory device 100 may minimize error bits coming from a high-temperature process by performing the initial program operation and the normal program operation forming different threshold voltage distributions.

In operation S110, the non-volatile memory device 100 may determine whether to enter the SMT mode. The SMT mode may be a program mode before the non-volatile memory device 100 experiences the SMT process. According to an embodiment, the program mode after the non-volatile memory device 100 experiences the SMT process may be the normal mode.

According to an embodiment, the non-volatile memory device 100 may enter the SMT mode through the set feature command S_CMD. The memory controller 200 may configure the set feature for setting the SMT mode with respect to the non-volatile memory device 100. The non-volatile memory device 100 may receive a program command and may check the configured mode. For example, the non-volatile memory device 100 may determine whether the configured set feature corresponds to the SMT mode or the normal mode. When the configured set feature corresponds to the SMT mode, operation S120 may be performed, and when the configured set feature corresponds to the normal mode, operation S142 may be performed.

In operation S120, the non-volatile memory device 100 may perform the initial program operation. The initial program operation may include multi-step initial program operations. In this specification, for convenience of description, below, a description will be given with the initial program operation including a 1-step initial program operation which is a first step of the initial program operation and a 2-step initial program operation which is a second step of the initial program operation, but the present disclosure is not limited thereto. According to an embodiment, the initial program operation may further include a 3-step initial program operation which is a third step of initial program operation.

The non-volatile memory device 100 may perform the initial program operation such that a plurality of memory cells form a first threshold voltage distribution based on a first verify voltage set. According to an embodiment, the first verify voltage set may include first initial verify voltages and second initial verify voltages. In this case, the first initial verify voltages may be used in the 1-step initial program operation, and the second initial verify voltages may be used in the 2-step initial program operation.

Magnitudes of the second initial verify voltages may be greater than magnitudes of the first initial verify voltages. For example, a magnitude of a specific second initial verify voltage may be greater than a magnitude of its corresponding first initial verify voltage. Accordingly, a threshold voltage distribution after the 2-step initial program operation is performed may be narrower than a threshold voltage distribution after the 1-step initial program operation is performed. Herein, the threshold voltage distribution after the 2-step initial program operation is performed may correspond to the first threshold voltage distribution.

After the initial program operation is completed, in operation S130, the non-volatile memory device 100 may experience the SMT process. In the SMT process, as described above, the non-volatile memory device 100 may be mounted on a printed circuit board at a high temperature. In this case, the first threshold voltage distribution may be changed due to the SMT process.

In operation S140, the non-volatile memory device 100 that experiences the SMT process may perform a migration operation. The migration operation may mean an operation in which the first threshold voltage distribution changed due to the SMT process migrates to a second threshold voltage distribution. In other words, through the migration operation, the non-volatile memory device 100 may change a program state to be appropriate for a user environment. The migration operation may include the first read operation and the normal program operation.

In operation S141, the non-volatile memory device 100 may perform the first read operation. Through the first read operation, the non-volatile memory device 100 may read data stored in a plurality of memory cells forming the first threshold voltage distribution thus changed through the first read operation. The first read operation may be performed based on a first read level set. The first read operation will be described in detail with reference to FIG. 11.

In operation S142, the non-volatile memory device 100 may perform the normal program operation. The non-volatile memory device 100 may perform the normal program operation such that the plurality of memory cells form the second threshold voltage distribution based on a second verify voltage set. The second verify voltage set may include verify voltages for the normal program operation. The second verify voltage set may include values stored in advance and may change according to a user environment.

The plurality of memory cells that are targeted for the initial program operation in operation S120 and the normal program operation in operation S142 may store the same number of bits. For example, both the initial program operation and the normal program operation may be performed on triple level cells. In this case, the performance of the non-volatile memory device 100 may be tested before the placement step M3 in a state where a large amount of data are used compared to the SLC manner. Accordingly, test efficiency may be increased, and the yield may increase.

In operation S150, the non-volatile memory device 100 may perform the second read operation. Through the second read operation, the non-volatile memory device 100 may read data stored in the plurality of memory cells forming the second threshold voltage distribution. The second read operation may be performed based on a second read level set. According to an embodiment, magnitudes of read voltages included in the second read level set may be greater than magnitudes of read voltages included in the first read level set. However, because the second read level set may change according to a user environment, the magnitudes of the read voltages included in the first read level set and the magnitudes of the read voltages included in the second read level set are not limited thereto.

According to an embodiment, the non-volatile memory device 100 may receive a program command or a read command and may perform different operations depending on modes. FIG. 6B is a flowchart for describing a program operation S200 according to a mode, and FIG. 6C is a flowchart for describing a read operation S300 according to a mode.

Referring to FIGS. 6A and 6B, in operation S201, the non-volatile memory device 100 may receive the program command from an external device. According to an embodiment, the external device may be the memory controller 200 of FIG. 1. In operation S202, the non-volatile memory device 100 may check whether an operating mode is the SMT mode. The operating mode may include the SMT mode and the normal mode. According to an embodiment, operation S201 and operation S202 may be integrated to operation S110 of FIG. 6A. For example, the non-volatile memory device 100 may receive the program command and may check the SMT mode or the normal mode based on the configured set feature.

When it is determined that the operating mode is the SMT mode, in operation S203, the non-volatile memory device 100 may perform the initial program operation. The initial program operation in operation S203 is similar to that in operation S120 of FIG. 6A, and thus, additional description will be omitted to avoid redundancy. In other words, the non-volatile memory device 100 may perform a multi-step program operation such that a plurality of memory cells form the first threshold voltage distribution.

When it is determined that the operating mode is not the SMT mode, in operation S204, in other words, when it is determined that the operating mode is the normal mode, the non-volatile memory device 100 may perform the normal program operation. The normal program operation in operation S204 is similar to that in operation S142 of FIG. 6A, and thus, additional description will be omitted to avoid redundancy. In other words, the non-volatile memory device 100 may perform a single-step program operation such that the plurality of memory cells form the second threshold voltage distribution. Herein, the first threshold voltage distribution may be formed to be narrower in width than the second threshold voltage distribution.

Referring to FIGS. 6A and 6C, in operation S301, the non-volatile memory device 100 may receive the read command from the external device. According to an embodiment, the external device may be the memory controller 200 of FIG. 1. The read command may include a first read command and a second read command that are different from each other, but the present disclosure is not limited thereto. For example, the first read command and the second read command may be identical, and different read operations may be performed depending on operating modes.

In operation S302, the non-volatile memory device 100 may check whether an operating mode is the SMT mode. Operation S302 of FIG. 6C is similar to operation S202 of FIG. 6B, and thus, additional description will be omitted to avoid redundancy. For example, the non-volatile memory device 100 may receive the read command and may check the SMT mode or the normal mode based on the configured set feature.

When it is, determined that the operating mode is the SMT mode, in operation S303, the non-volatile memory device 100 may perform the first read operation. The first read operation in operation S303 is similar to that in operation S141 of FIG. 6A, and thus, additional description will be omitted to avoid redundancy. In other words, the non-volatile memory device 100 may read the first threshold voltage distribution of memory cells programmed in the SMT mode, based on the first read level set.

When it is determined that the operating mode is not the SMT mode, in operation S304, in other words, when it is determined that the operating mode is the normal mode, the non-volatile memory device 100 may perform the second read operation. The second read operation in operation S304 is similar to that in operation S150 of FIG. 6A, and thus, additional description will be omitted to avoid redundancy. In other words, the non-volatile memory device 100 may read the second threshold voltage distribution of memory cells programmed in the normal mode, based on the second read level set.

Figure 7:
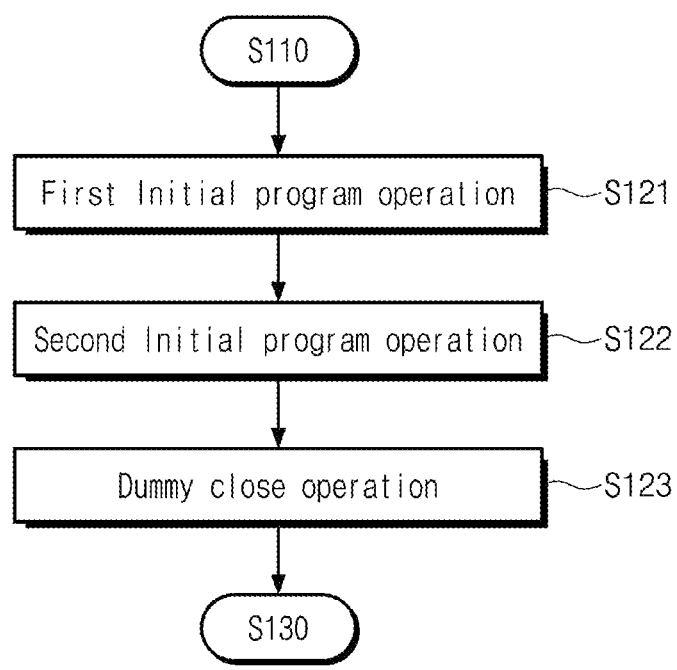
FIGS. 7, 8A, 8B, 9A and 9B are diagrams for describing an initial program operation of FIG. 6A.
Figure 8A:
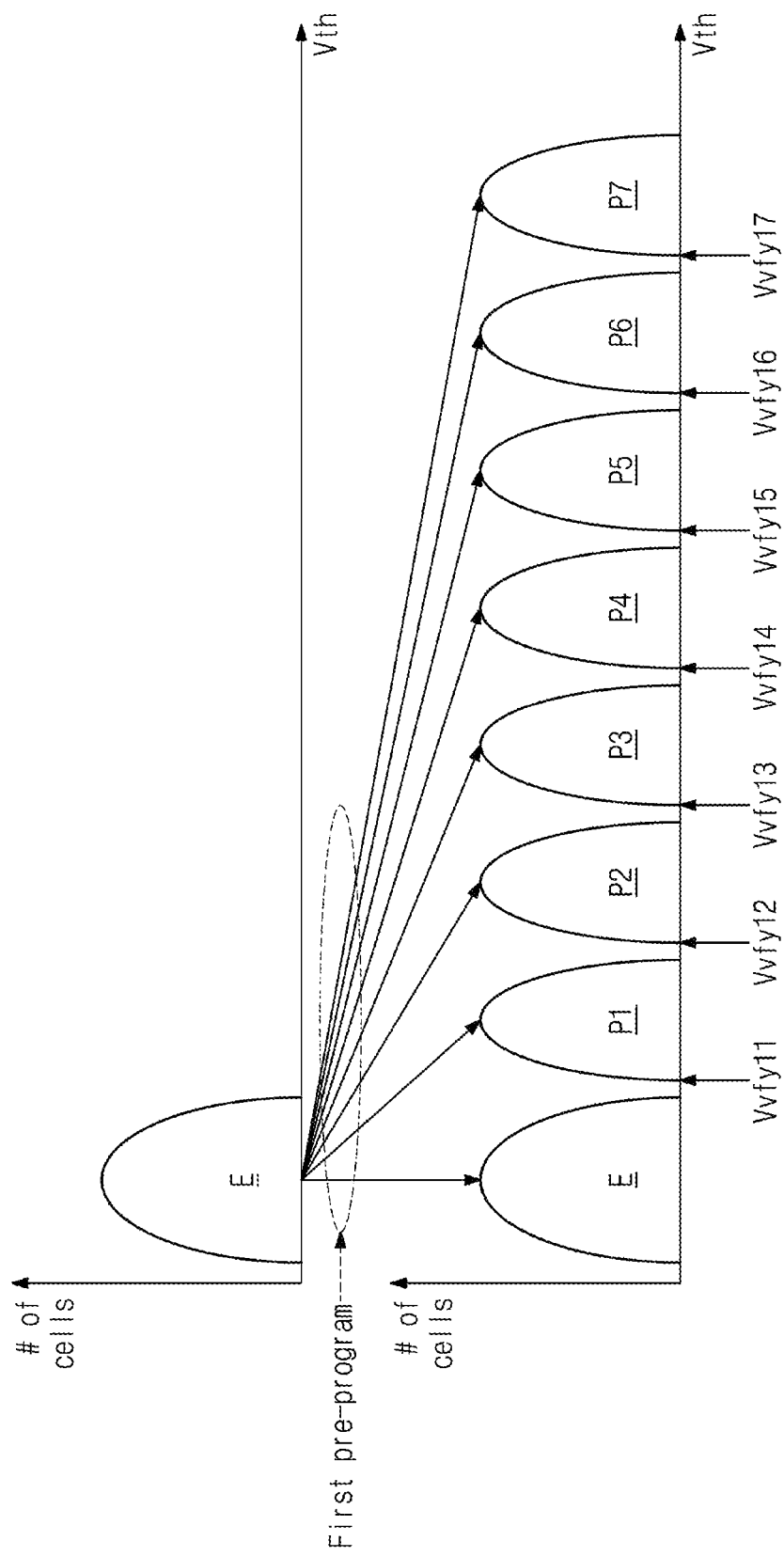
Figure 8B:
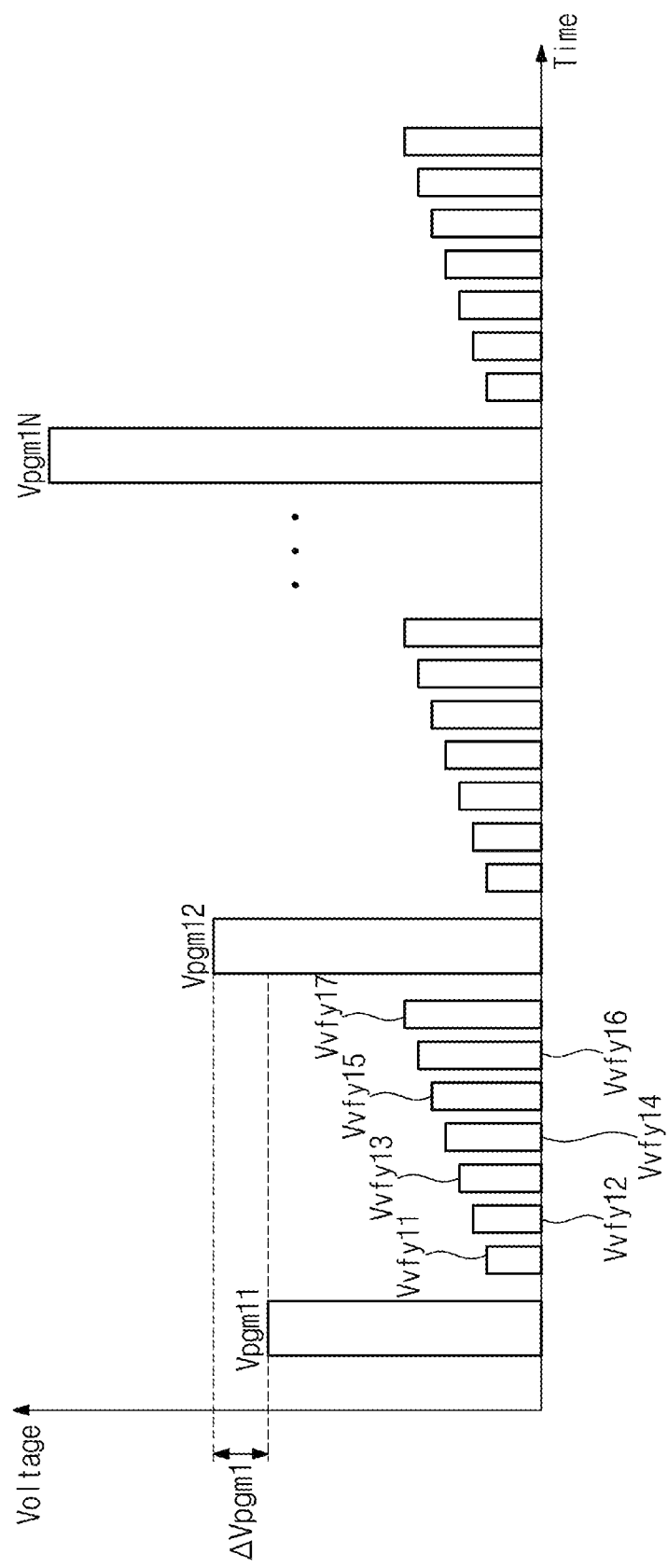
Figure 9A:
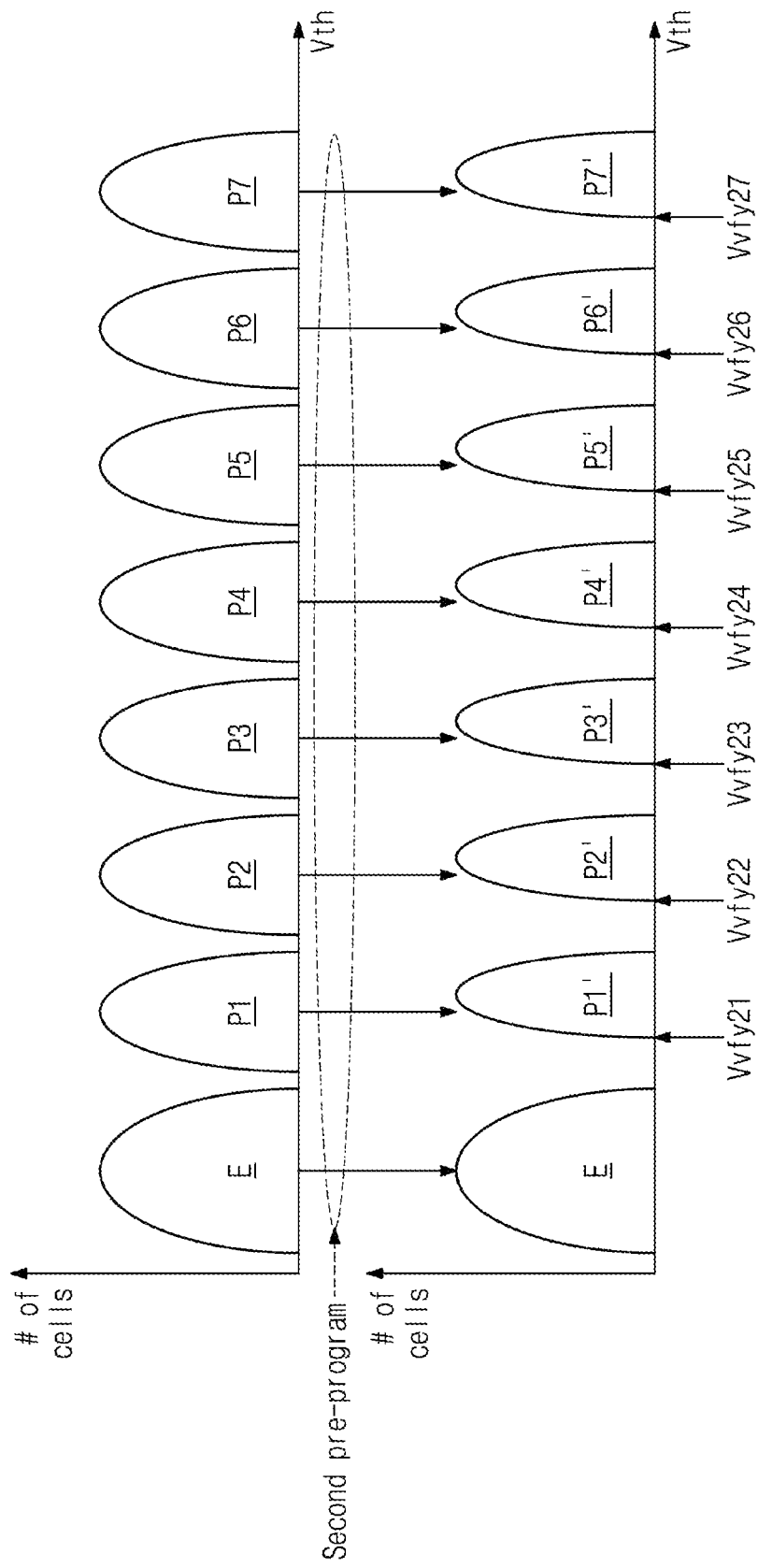
Figure 9B:
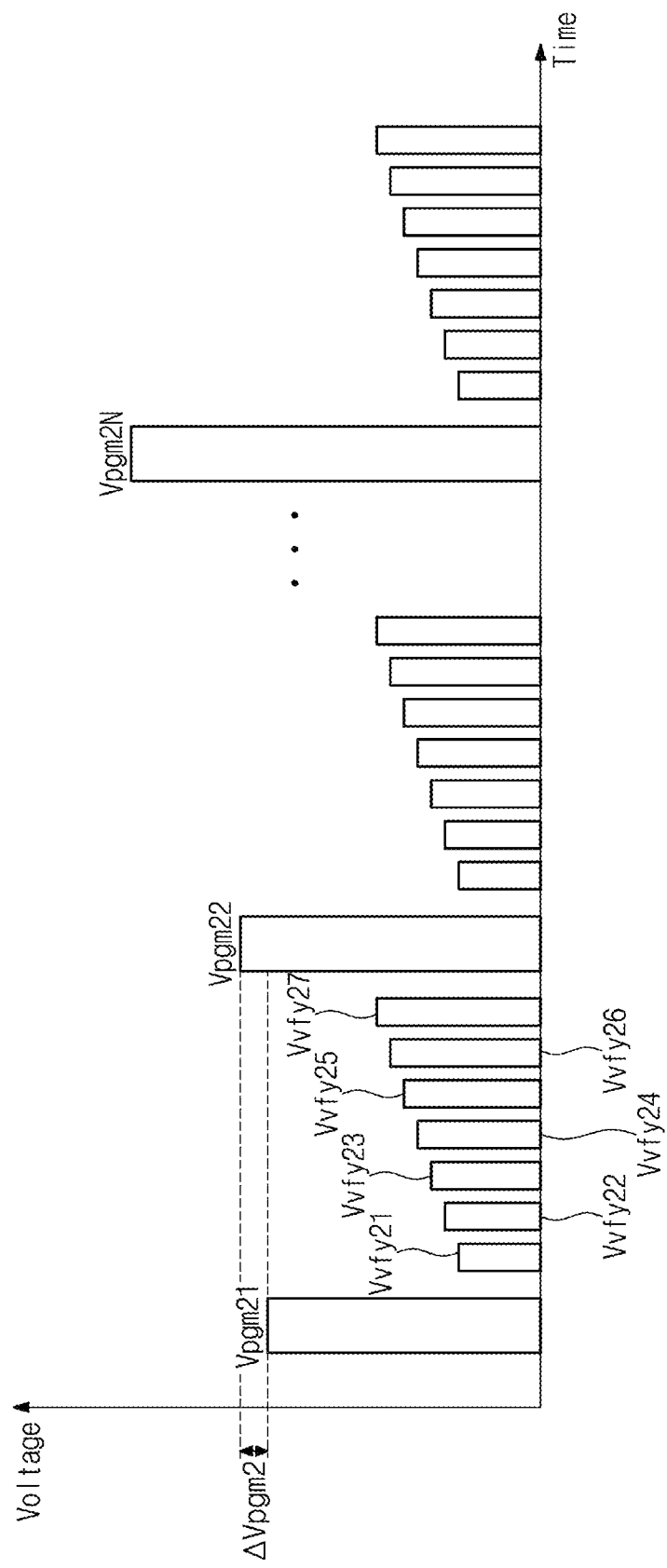

FIGS. 7 to 9B are diagrams for describing an initial program operation of FIG. 6A. FIG. 7 is a flowchart illustrating operation S120 of FIG. 6A in detail, FIGS. 8A and 8B illustrate an example of a 1-step initial program operation, and FIGS. 9A and 9B illustrate an example of a 2-step initial program operation.

Referring to FIGS. 1, 6A, and 7, the initial program operation may include the 1-step initial program operation, the 2-step initial program operation, and a dummy close operation. The initial program operation may be performed through a plurality steps, the 1-step initial program operation may correspond to the first step, and the 2-step initial program operation may correspond to the second step.

In operation S121, the non-volatile memory device 100 may perform the 1-step initial program operation. The 1-step initial program operation may be performed in a one-shot program manner or a multi-step program manner including at least two program operations. For convenience, the following description will be given under the assumption that the 1-step initial program operation is performed in the one-shot program manner, but the present disclosure is not limited thereto.

Referring to FIGS. 8A and 8B, the non-volatile memory device 100 may have threshold voltage distributions corresponding to the erase state "E" and the program states P1 to P7 through the 1-step initial program operation. Before the 1-step initial program operation, all memory cells may have a threshold voltage corresponding to the erase state "E". This is shown in the top graph of FIG. 8A. Afterwards, the non-volatile memory device 100 may perform the 1-step initial program operation in response to the program command P_CMD from the memory controller 200.

According to an embodiment, during the 1-step initial program operation, multi-bit data, for example, 3-bit data may be programmed in selected memory cells while repeating program loops. The 1-step initial program operation may be performed in the incremental step pulse programming (ISPP) manner where a program voltage is increased as much as a given increment in the iteration of a program loop.

While the 1-step initial program operation is performed, one of first program voltages Vpgm11, Vpgm12, and Vpgm1N and first initial verify voltages Vvfy11, Vvfy12, Vvfy13, Vvfy14, Vvfy15, Vvfy16 and Vvfy17 respectively corresponding to the program states P1 to P7 may be used for each program loop. The first program voltages Vpgm11, Vpgm12, and Vpgm1N may be increased as much as a first increment ΔVpgm1 as the number of program loops increases.

Returning to FIG. 7, in operation S122, the non-volatile memory device 100 may perform the 2-step initial program operation. The 2-step initial program operation may be performed after the 1-step initial program operation is completed. As in the 1-step initial program operation, during the 2-step initial program operation, multi-bit data, for example, 3-bit data may be programmed in the selected memory cells while repeating program loops. The 2-step initial program operation may be performed depending on the ISPP manner.

Referring to FIGS. 9A and 9B, the non-volatile memory device 100 may have threshold voltage distributions corresponding to the erase state "E" and the program states P1' to P7' through the 2-step initial program operation. This is shown by the lower graph in FIG. 9A. The program states P1' to P7' may be formed to be denser than the program states P1 to P7. For example, the program state P1' may ne narrower in width than the program state P1, the program state P2' may be narrower in width than the program state P2, and so forth. In other words, a threshold voltage distribution formed through the 2-step initial program operation may be denser than a threshold voltage distribution formed through the 1-step initial program operation.

While the 2-step initial program operation is performed, one of first program voltages Vpgm21, Vpgm22, and Vpgm2N and second initial verify voltages Vvfy21, Vvfy22, Vvfy23, Vvfy24, Vvfy25, Vvfy26 and Vvfy27 respectively corresponding to the program states P1' to P7' may be used for each program loop. The second program voltages Vpgm21, Vpgm22, and Vpgm2N may be increased as much as a second increment ΔVpgm2 as the number of program loops increases.

According to an embodiment, the increment of program voltages in the 1-step initial program operation may be different from the increment of program voltages in the 2-step initial program operation. For example, the first increment ΔVpgm1 in the 1-step initial program operation may be greater than the increment ΔVpgm2 in the 2-step initial program operation. Accordingly, the 1-step initial program operation may program data to be faster than the 2-step initial program operation.

Magnitudes of initial verify voltages in the 1-step initial program operation may be different from magnitudes of initial verify voltages in the 2-step initial program operation. For example, magnitudes of the second initial verify voltages Vvfy21 to Vvfy27 may be greater than magnitudes of the first initial verify voltages Vvfy11 to Vvfy17. Accordingly, a threshold voltage distribution formed through the 2-step initial program operation may be denser than a threshold voltage distribution formed through the 1-step initial program operation.

In other words, the non-volatile memory device 100 may sharply form a threshold voltage distribution through the initial program operation. Accordingly, when the non-volatile memory device 100 performs the initial program operation and is then passed through the SMT process line, intervals between threshold voltage distributions of respective program states may be formed to be wider than when the non-volatile memory device 100 performs a conventional program operation and is then passed through the SMT process line. In other words, the non-volatile memory device 100 may secure a maximum read window through the initial program operation, and thus the performance of read may be improved.

Returning to FIG. 7, in operation S123, the non-volatile memory device 100 may perform the dummy close operation. The dummy close operation may be performed for each memory block. For example, the non-volatile memory device 100 may determine whether a word line of an erase state is present in the selected memory block. When the word line of the erase state is present in the selected memory block, the non-volatile memory device 100 may program dummy data or garbage data in memory cells of the corresponding word line. When the word line of the erase state is absent from the selected memory block, the non-volatile memory device 100 may complete the dummy close operation.

The non-volatile memory device 100 may increase the reliability of data through the dummy close operation. In the case where the non-volatile memory device 100 is exposed to a high-temperature environment in a state where there is a word line left alone in the erase state, a sharp charge loss may occur at memory cells of word lines adjacent to the word line that was left alone. In other words, error bits may occur due to the high-temperature degradation. Accordingly, the non-volatile memory device 100 may perform the dummy close operation such that the word line of the erase state is absent.

According to an embodiment, the dummy close operation in operation S123 may be omitted.

The non-volatile memory device 100 may divide the initial program operation into the 1-step initial program operation and the 2-step initial program operation, and may repeatedly perform the 1-step initial program operation and the 2-step initial program operation. As such, a threshold voltage distribution formed through the 2-step initial program operation may be sharper in shape (e.g., narrower) than a threshold voltage distribution formed through the 1-step initial program operation. According to an embodiment, the non-volatile memory device 100 may include the dummy close operation in the initial program operation, thus increasing the reliability of data. Accordingly, the non-volatile memory device 100 may increase a read margin between adjacent program states through the initial program operation, thus increasing the reliability of data.

FIG. 10 is a diagram for describing an order of initial program operations of FIG. 6A. Referring to FIGS. 2, 3, 6A, 7, and 10, the non-volatile memory device 100 may perform the initial program operation on the first to eighth word lines WL1 to WL8. For example, the non-volatile memory device 100 may sequentially perform the initial program operations on the first to eighth word lines WL1 to WL8 through first to sixteenth steps.

At the first step, the non-volatile memory device 100 may receive data to be stored in memory cells of the eighth word line WL8 and may perform the 1-step initial program operation on the eighth word line WL8 based on the received data. According to an embodiment, the non-volatile memory device 100 may include first to fourth string selection lines SSL0, SSL1, SSL2, and SSL3; thus, at the first step, the 1-step initial program operation may be sequentially performed on the first to fourth string selection lines SSL0, SSL1, SSL2, and SSL3. This is notated as 1-1, 1-2, 1-3, and 1-4 in FIG. 10.

After the 1-step initial program operation for the eighth word line WL8 is completed, at the second step, the non-volatile memory device 100 may receive data to be stored at memory cells of the seventh word line WL7 and may perform the 1-step initial program operation on the seventh word line WL7 based on the received data. According to an embodiment, at the second step, the 1-step initial program operation may be sequentially performed on the first to fourth string selection lines SSL0, SSL1, SSL2, and SSL3. This is notated as 2-1, 2-2, 2-3, and 2-4 in FIG. 10.

After the 1-step initial program operation for the seventh word line WL7 is completed, at the third step, the non-volatile memory device 100 may perform the 2-step initial program operation on the eighth word line WL8. According to an embodiment, at the third step, the 2-step initial program operation may be sequentially performed on the first to fourth string selection lines SSL0, SSL1, SSL2, and SSL3. This is notated as 3-1, 3-2, 3-3, and 3-4 in FIG. 10.

After the 2-step initial program operation for the eighth word line WL8 is completed, at the fourth step, the non-volatile memory device 100 may receive data to be stored in memory cells of the sixth word line WL6 and may perform the 1-step initial program operation on the sixth word line WL6 based on the received data. According to an embodiment, at the fourth step, the 1-step initial program operation may be sequentially performed on the first to fourth string selection lines SSL0, SSL1, SSL2, and SSL3. This is notated as 4-1, 4-2, 4-3, and 4-4 in FIG. 10.

After the 1-step initial program operation for the sixth word line WL6 is completed, at the fifth step, the non-volatile memory device 100 may perform the 2-step initial program operation on the seventh word line WL7. According to an embodiment, at the fifth step, the 2-step initial program operation may be sequentially performed on the first to fourth string selection lines SSL0, SSL1, SSL2, and SSL3. This is notated as 5-1, 5-2, 5-3, and 5-4 in FIG. 10. The remaining steps, in other words, the sixth to sixteenth steps are similar to those described above, and thus, additional description will be omitted to avoid redundancy.

Figure 11:
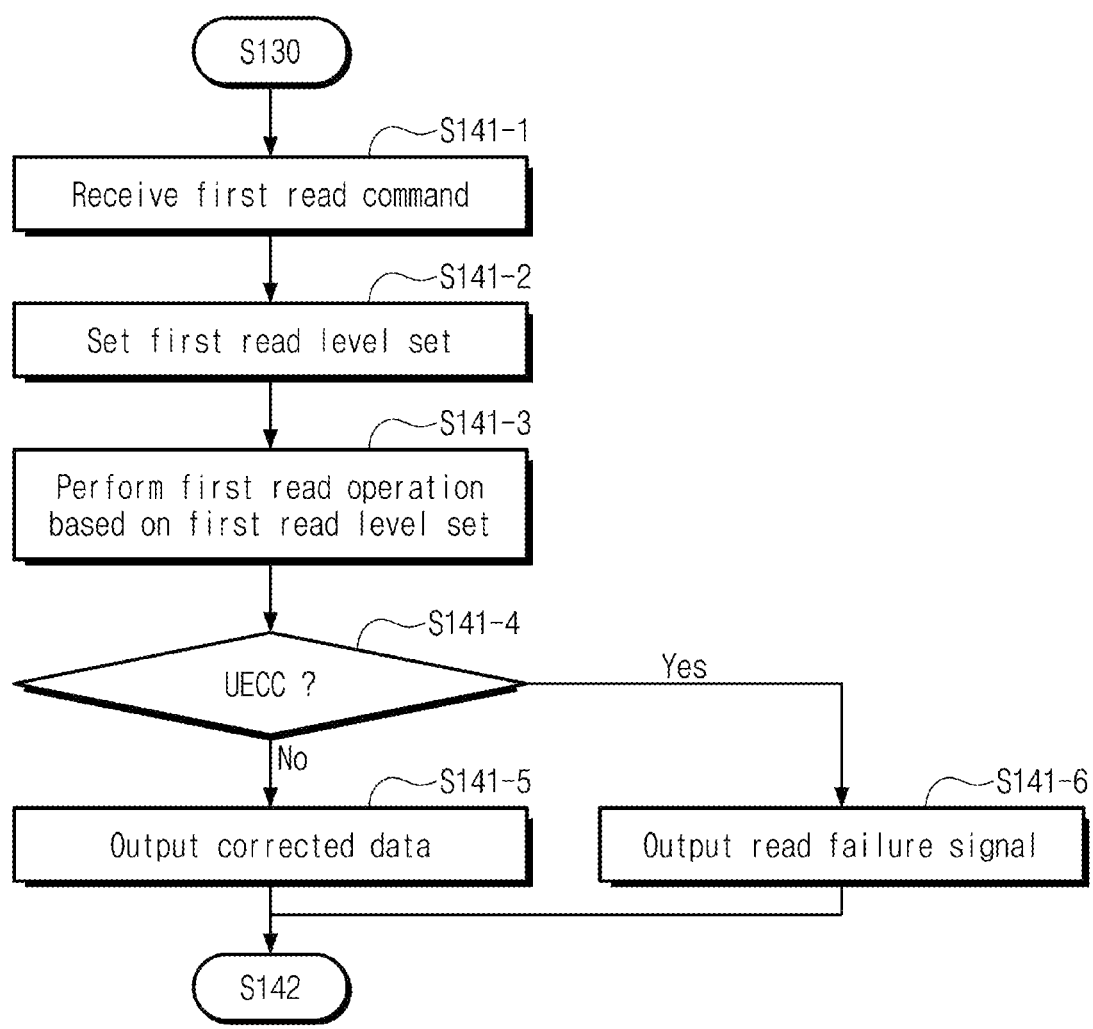
FIG. 11 is a flowchart for describing a first read operation of FIG. 6A.

FIG. 11 is a flowchart for describing a first read operation of FIG. 6A. Referring to FIGS. 1, 2, 6A, and 11, the non-volatile memory device 100 may change a first threshold voltage distribution changed after experiencing the SMT process, through migration, into a second threshold voltage distribution. To accomplish this, the migration operation may include the first read operation for reading the first threshold voltage distribution thus changed.

In operation S141-1, the non-volatile memory device 100 may receive the first read command R1_CMD. For example, the control logic circuit 150 may receive the first read command R1_CMD from the memory controller 200.

In operation S141-2, the non-volatile memory device 100 may configure the first read level set. In other words, the non-volatile memory device 100 may set the first read level set. The first read level set may include at least one of a first read voltage set and a first read time set. For example, the control logic circuit 150 may control the voltage generator 160 in response to the first read command R1_CMD to configure the first read voltage set. The voltage generator 160 may output read voltages corresponding to the first read voltage set under control of the control logic circuit 150.

According to an embodiment, the control logic circuit 150 may control the page buffer circuit 130 in response to the first read command R1_CMD to configure the first read time set. The page buffer circuit 130 may adjust read times or develop times corresponding to the first read time set under control of the control logic circuit 150.

In operation S141-3, the non-volatile memory device 100 may perform the first read operation based on the first read level set. For example, the page buffer circuit 130 may include a plurality of latches, and the plurality of latches may read data stored in the memory cell array 110 by sensing a voltage level of a sensing node. This will be described in detail with reference to FIGS. 13 to 15.

In operation S141-4, the non-volatile memory device 100 may receive a signal indicating whether an UECC error occurs. For example, the non-volatile memory device 100 may provide the read data to the ECC circuit 250 of the memory controller 200. The ECC circuit 250 may determine whether the UECC error occurs in the read data, and may provide the non-volatile memory device 100 with a signal associated with a determination result.

According to an embodiment, the memory controller 200 may include pieces of information or a program code for performing a valley search operation. The memory controller 200 may detect and correct an error of the read data based on a detected valley value. When the error of the read data is corrected, in operation S141-5, the non-volatile memory device 100 may output the corrected data. When the error of the read data is not corrected (e.g., when the UECC error is included in the read data), in operation S141-6, the non-volatile memory device 100 may output a read failure signal. According to an embodiment, the memory controller 200 may send the read failure signal to the host.

Figure 12:
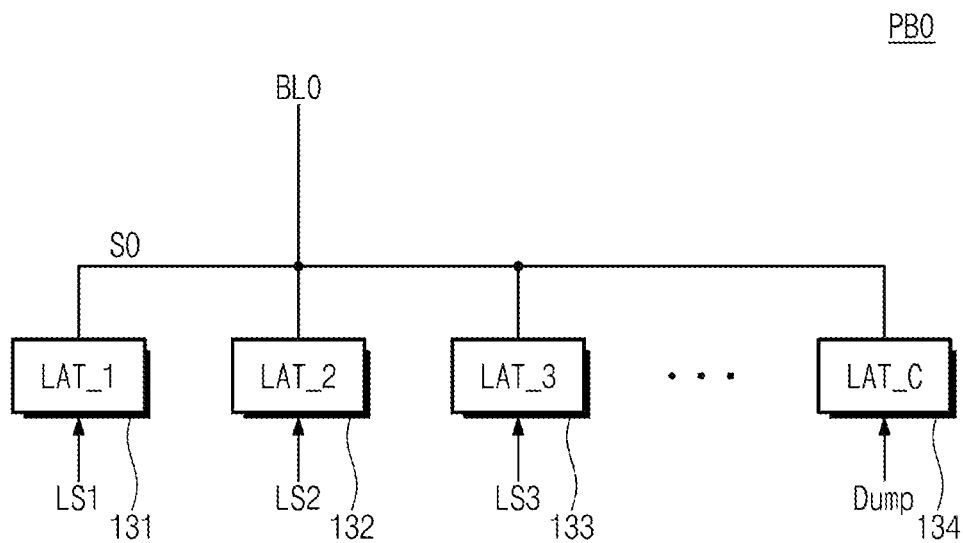
FIGS. 12, 13 and 14 are diagrams for describing a page buffer performing a first read operation of FIG. 11.
Figure 13:
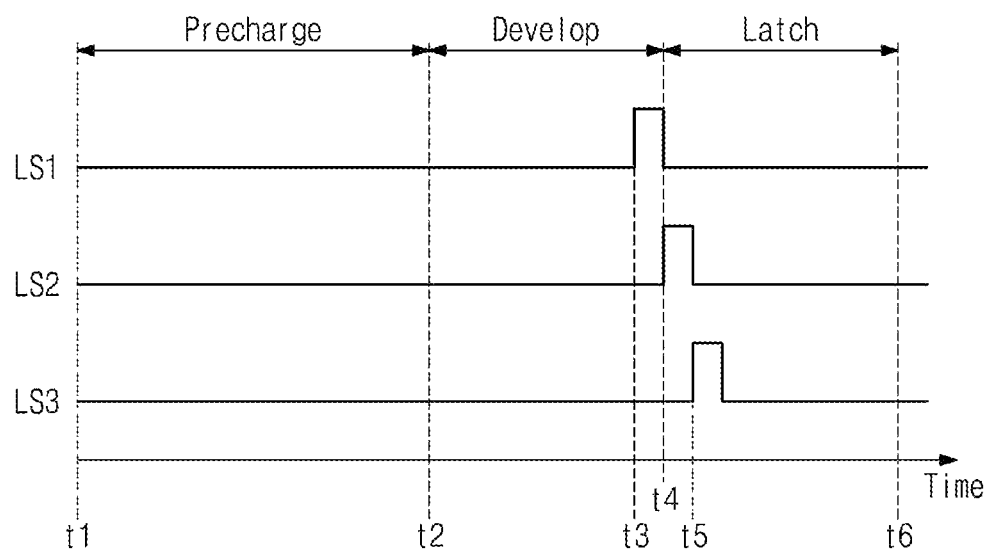
Figure 14:
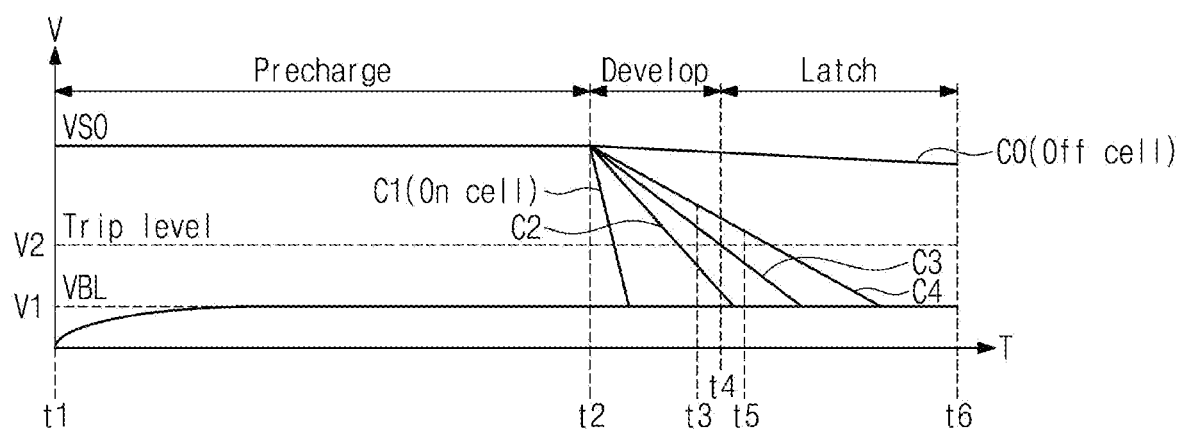

FIGS. 12 to 14 are diagrams for describing a page buffer performing a first read operation of FIG. 11. FIG. 12 is a block diagram for describing a structure of the page buffer PB0 of FIG. 2, and FIGS. 13 and 14 are timing diagrams for describing an operating method of the page buffer PB0 of FIG. 12.

Referring to FIGS. 2 and 12, the page buffer circuit 130 may include the plurality of page buffers PB0, PB1, . . . , PBn-1. The plurality of page buffers PB0, PB1, . . . , PBn-1 may be connected with the memory cell array 110 through the bit lines BLs. In the initial program operation or the program operation for the memory cell array 110, the plurality of page buffers PB0, PB1, . . . , PBn-1 may sense data stored in selected memory cells through the bit lines BLs.

The plurality of page buffers PB0, PB1, . . . , PBn-1 may be respectively connected with the bit lines BLs. For example, the page buffer PB0 may be connected with the bit line BL0. The page buffer PB0 may include a sensing node SO connected with the bit line BL0 and a plurality of latches 131, 132, 133, and 134 connected with the sensing node SO. The plurality of latches 131, 132, 133, and 134 may include the first, second and third latches 131, 132, and 133 and a C-latch 134. An example in which the page buffer PB0 includes four latches 131, 132, 133, and 134 is illustrated in FIG. 13, but the present disclosure is not limited thereto.

The first to third latches 131, 132, and 133 may store a data state stored in a cell string CS0. In other words, information about whether a selected memory cell is turned on or turned off depending on a word line voltage may be stored in the first to third latches 131, 132, and 133. The page buffer PB0 may latch a voltage level of the sensing node SO under different conditions and may store latching results in the first to third latches 131, 132, and 133.

The first to third latches 131, 132, and 133 may respectively latch voltage levels of the sensing node SO at different points in time and may store information indicating whether a selected memory cell is turned on or turned off. For example, the first latch 131 may latch a voltage level of the sensing node SO based on a first latch signal LS1 and may store information indicating whether a memory cell included in the cell string CS0 is turned on or turned off.

For example, the second latch 132 may latch a voltage level of the sensing node SO based on a second latch signal LS2 and may store information indicating whether the memory cell included in the cell string CS0 is turned on or turned off. For example, the third latch 133 may latch a voltage level of the sensing node SO based on a third latch signal LS3 and may store information indicating whether the memory cell included in the cell suing CS0 is turned on or turned off.

The first to third latch signals LS1, LS2, and LS3 may be respectively provided to the first to third latches 131, 132, and 133 at different points in time. For example, the first latch signal LS1 may be provided to the first latch 131 at a first point in time such that the first latch 131 latches a voltage level of the sensing node SO at the first point in time. The second latch signal LS2 may be provided to the second latch 132 at a second point in time such that the second latch 132 latches a voltage level of the sensing node SO at the second point in time. The third latch signal LS3 may be provided to the third latch 133 at a third point in time such that the third latch 133 latches a voltage level of the sensing node SO at the third point in time. The first to third points in time may be different from each other. For example, the first point in time may occur before the second point in time and the second point in time may occur before the third point in time.

That the first to third latches 131, 132, and 133 respectively latch voltage levels of the sensing node SO at different points in time may mean that there is determined whether a memory cell is turned on or turned off, with word line voltages of different voltage levels applied to the same word line connected with the memory cell at different points in time.

The control logic circuit 150 may temporarily store the data stored in the first to third latches 131, 132, and 133 in the C-latch 134 before the transfer to the input/output circuit 140. In other words, the data stored in the first to third latches 131, 132, and 133 may be moved to the C-latch 134. The C-latch 134 may latch and store the data stored in the first to third latches 131, 132, and 133 in response to a dump signal Dump.

Referring to FIGS. 12, and 13, a precharge operation may be performed from a first point in time t1 to a second point in time t2. During the precharge operation, the bit line BL0 and the sensing node SO connected with the bit line BL0 may be charged to a specific voltage level. The sensing node SO may be charged, for example, to a power supply voltage.

At the second point in time t2, a develop operation may be performed. At the second point in time t2, the supply of a current from a power source to the sensing node SO may be blocked, and a voltage level of the sensing node SO may change depending on whether a memory cell is turned on or turned off. For example, when a selected memory cell is an on cell, the amount of current flowing to the bit line BL0 may be relatively large, and thus, a voltage level of the sensing node SO may decrease relatively quickly. When the selected memory cell is an off cell, the amount of current flowing to the bit line BL0 may be relatively small, and thus, a voltage level of the sensing node SO may be relatively uniform.

A time period where the develop operation is performed may differ depending on the first to third latches 131, 132, and 133. For example, a reference point in time may be a fourth point in time t4, a point in time earlier than the reference point in time by a given time may be a third point in time t3, and a point in time later than the reference point in time by the given time may be a fifth point in time t5.

For example, the develop operation associated with the first latch 131 may be performed from the second point in time t2 to the third point in time t3, and the first latch signal LS1 may be provided to the first latch 131 at the third point in time t3. The develop operation associated with the second latch 132 may be performed from the second point in time t2 to the fourth point in time t4, and the second latch signal LS2 may be provided to the second latch 132 at the fourth point in time t4. The develop operation associated with the third latch 133 may be performed from the second point in time t2 to the fifth point in time t5, and the third latch signal LS3 may be provided to the third latch 133 at the fifth point in time t5.

After the develop operation is completed, a latch operation may be performed. The first to third latches 131, 132, and 133 may respectively latch voltage levels of the sensing node SO at different points in time and may store information indicating whether a selected memory cell is turned on or turned off.

In the case where a time (hereinafter referred to as a "develop time") during which the develop operation of the sensing node SO is performed increases, a memory cell that is an off cell may be determined as an on cell. In contrast, in the case where the develop time of the sensing node SO decreases, a memory cell that is an on cell may be determined as an off cell.

In other words, in the case of a memory cell whose threshold voltage is similar in level to a read voltage provided to a word line, an increase in the develop time of the sensing node SO may provide a sensing effect by lowering a read voltage. In contrast, in the case of a memory cell whose threshold voltage is similar in level to a read voltage provided to a word line, a decrease in the develop time of the sensing node SO may provide a sensing effect by increasing the read voltage.

Referring to FIG. 14, a voltage curve C0 of a strong off cell (C0(off cell)) having no influence of the develop time of the sensing node SO and a voltage curve C1 of a strong on cell (C1(On cell)) having no influence of the develop time of the sensing node SO are illustrated. In FIG. 14, "VSO" indicates a voltage level of the sensing node SO, and "VBL" indicates a voltage level of a bit line.

In addition, voltage curves C2, C3, and C4 having an influence of the develop time of the sensing node SO are illustrated. The voltage curves C2, C3 and C4 are located between the voltage curve C0 of a strong off cell and the voltage curve C1 of a strong on cell. The voltage curve C2 shows a voltage change of the sensing node SO in the develop operation that is performed on a memory cell whose threshold voltage is smaller than a read voltage. The voltage curve C3 shows a voltage change of the sensing node SO in the develop operation that is performed on a memory cell whose threshold voltage is similar to the read voltage. The voltage curve C4 shows a voltage change of the sensing node SO in the develop operation that is performed on a memory cell whose threshold voltage is larger than the read voltage.

For example, when the latch timing is advanced with respect to the fourth point in time t4, the memory cell corresponding to the voltage curve C2 may be determined as an on cell. In this case, a logical value corresponding to the off cell may be latched. This provides the same effect as the sensing operation is performed with an increased read voltage. In contrast, when the latch timing is delayed with respect to the fourth point in time t4, the memory cell corresponding to the voltage curve C4 may be determined as an off cell. In this case, a logical value corresponding to the on cell may be latched. This provides the same effect as the sensing operation is performed with a decreased read voltage.

As described above, the non-volatile memory device 100 according to an embodiment of the present disclosure may obtain the same effect as data stored in a memory cell are sensed while changing a read voltage through the adjustment of the latch timing during the develop operation. The adjustment of the latch timing may be accomplished by adjusting the timing to provide the first to third latch signals LS1 to LS3 to the first to third latches 131 to 133.

Figure 15:
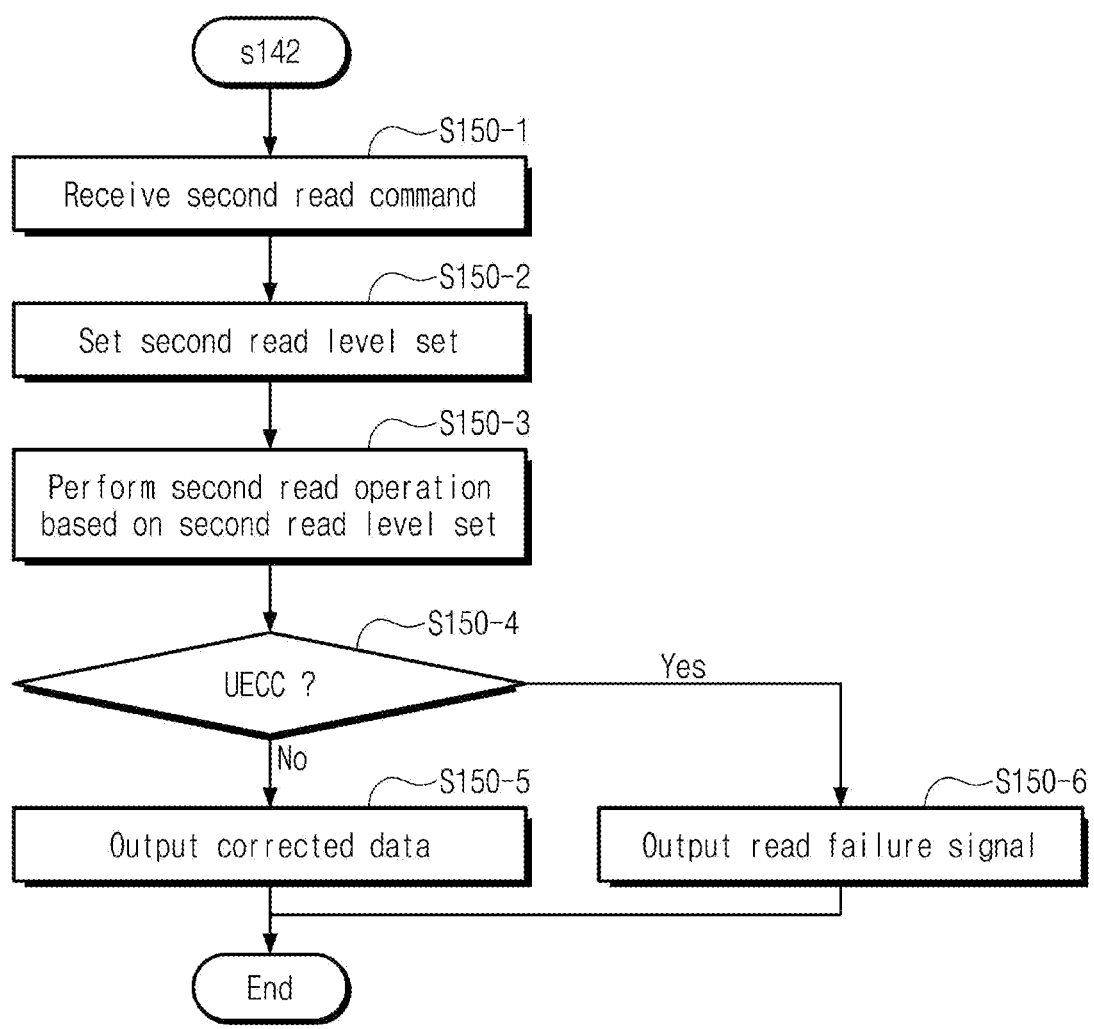
FIGS. 15 and 16 are diagrams for describing a second read operation of FIG. 6A.
Figure 16:
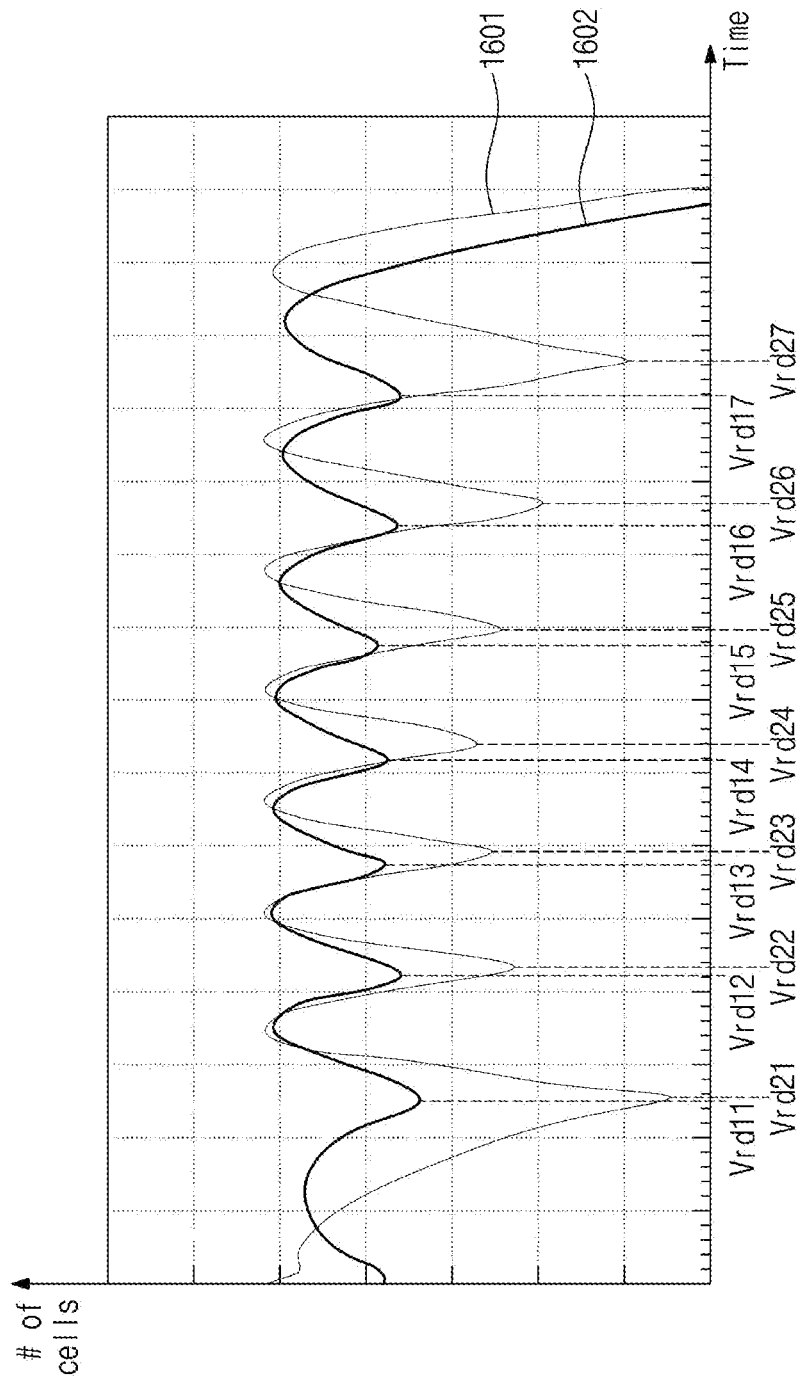

FIGS. 15 and 16 are diagrams for describing a second read operation of FIG. 6A. Referring to FIGS. 1, 2, 6A, and 15, the non-volatile memory device 100 may perform the normal program operation and may then program the second read operation. The non-volatile memory device 100 may form the second threshold voltage distribution through the normal program operation and may read data stored in a plurality of memory cells forming the second threshold voltage distribution through the second read operation.

In operation S150-1, the non-volatile memory device 100 may receive the second read command R2_CMD. For example, the control logic circuit 150 may receive the second read command R2_CMD from the memory controller 200.

In operation S150-2, the non-volatile memory device 100 may configure the second read level set. The second read level set may include at least one of a second read voltage set and a second read time set. For example, the control logic circuit 150 may control the voltage generator 160 in response to the second read command R2_CMD to configure the second read voltage set. The voltage generator 160 may output read voltages corresponding to the second read voltage set under control of the control logic circuit 150.

In operation S150-3, the non-volatile memory device 100 may perform the second read operation based on the second read level set. For example, the page buffer circuit 130 may include a plurality of latches, and the plurality of latches may read data stored in the memory cell array 110 by sensing a voltage level of a sensing node. The latches of the page buffer circuit 130 may correspond to those shown in FIG. 12.

In other words, the second read operation is similar to the first read operation except that the second read operation is performed based on the second read level set. The second read level set may be different from the first read level set. For example, the first read level set may be the first read voltage set, and the second read level set may be the second read voltage set. According to an embodiment, read voltages of the second read voltage set may be larger in magnitude than read voltages of the first read voltage set.

Referring to FIG. 16, first read voltage set Vrd11, Vrd12, Vrd13, Vrd14, Vrd15, Vrd17 and Vrd17 may be different from second read voltage set Vrd21, Vrd22, Vrd23, Vrd24, Vrd25, Vrd26 and Vrd27. The first read voltage set Vrd11 to Vrd17 may include read voltages for reading memory cells corresponding to a first distribution diagram 1601, and the second read voltage set Vrd21 to Vrd27 may include read voltages for reading memory cells corresponding to a second distribution diagram 1602.

According to an embodiment, the first distribution diagram 1601 may be the first threshold voltage distribution changed after the SMT process. The second distribution diagram 1602 may be the second threshold voltage distribution after the normal program operation. As such, the voltage generator 160 may output the read voltages corresponding to the first read voltage set Vrd11 to Vrd17 in the first read operation, and may output the read voltages corresponding to the second read voltage set Vrd21 to Vrd27 in the second read operation.

Returning to FIG. 15, operation S150-4, operation S150-5, and operation S150-6 are similar to operation S141-4, operation S141-5, and operation S141-6 of FIG. 11, and thus, additional description will be omitted to avoid redundancy. In operation S150-4, the non-volatile memory device 100 may receive a signal indicating whether an UECC error occurs.

According to an embodiment, the memory controller 200 may include pieces of information or a program code for performing a valley search operation. The memory controller 200 may detect and correct an error of the read data based on a detected valley value. When the error of the read data is corrected, in operation S150-5, the non-volatile memory device 100 may output the corrected data. When the error of the read data is not corrected (e.g., when the UECC error is included in the read data), in operation S150-6, the non-volatile memory device 100 may output a read failure signal.

Figure 17:
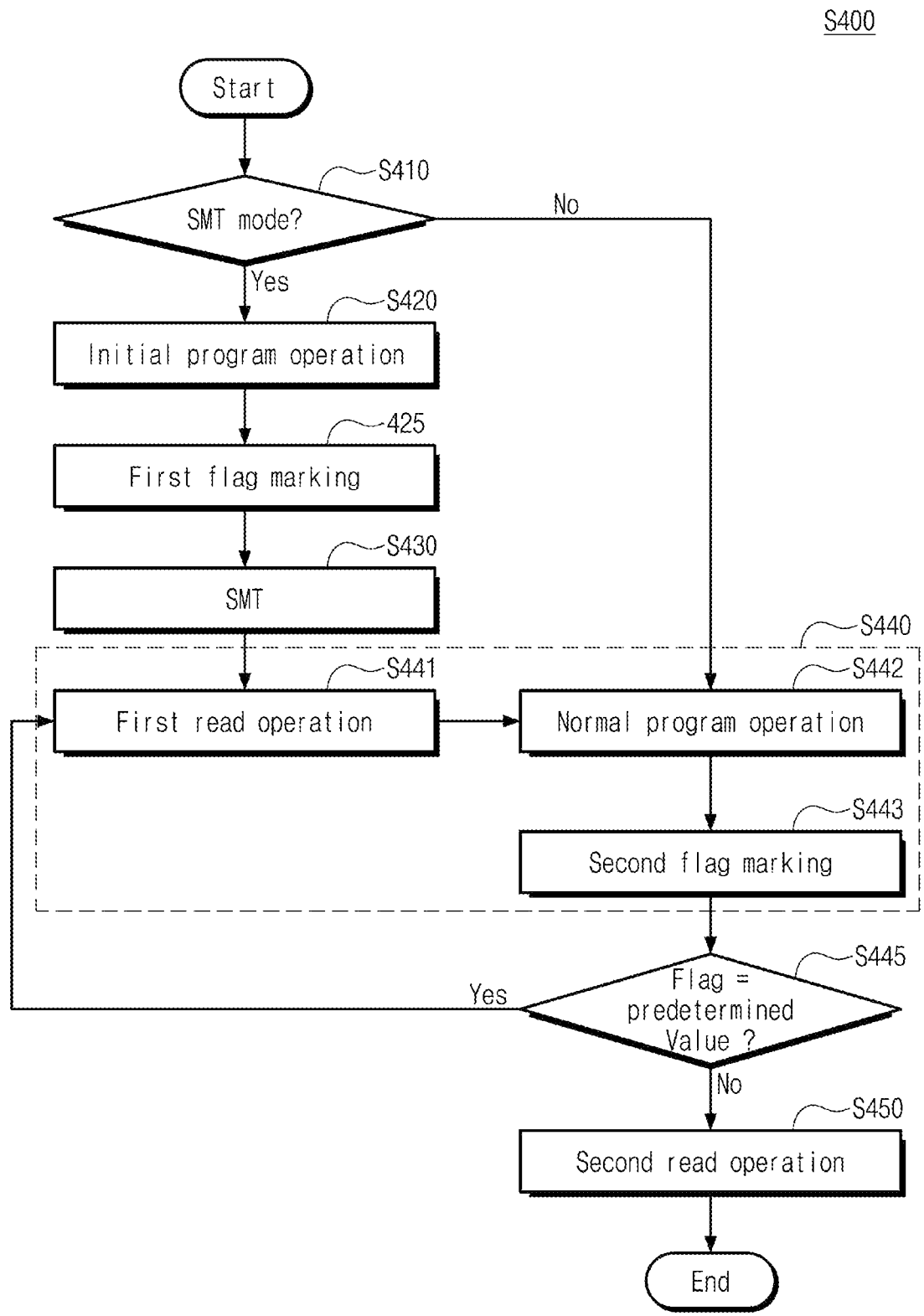
FIG. 17 is a flowchart illustrating an operating method of a non-volatile memory device according to an embodiment of the present disclosure.

FIG. 17 is a flowchart illustrating an operating method of a non-volatile memory device according to an embodiment of the disclosure concept. Referring to FIGS. 1, 2, 6A, and 17, an operating method S400 of the non-volatile memory device 100 may further include a flag marking operation, and thus, the non-volatile memory device 100 may be efficiently managed. Operation S410, operation S420, operation S430, operation S440, and operation S450 are similar to operation S110, operation S120, operation S130, operation S140, and operation S150 FIG. 6A, and thus, additional description will be omitted to avoid redundancy.

In operation S410, the non-volatile memory device 100 may determine whether to enter the SMT mode. The non-volatile memory device 100 may enter operation S420 in the SMT mode and may enter operation S442 in the normal mode.

In operation S420, the non-volatile memory device 100 may perform the initial program operation. The initial program operation includes the 1-step initial program operation which is a first step of initial program operation and the 2-step initial program operation which is a second step of initial program operation. The non-volatile memory device 100 may form a first threshold voltage distribution through the initial program operation.

In operation S425, the non-volatile memory device 100 may perform a first flag marking operation. The first flag marking operation may be performed for each memory block, but the present disclosure is not limited thereto. According to an embodiment, the first flag marking operation may be performed for each nonvolatile memory or for each word line. The non-volatile memory device 100 may mark a flag of a given value on memory blocks in which the initial program operation is completed. For example, the non-volatile memory device 100 may mark a flag of "1" on memory blocks in which the initial program operation is completed.

After the initial program operation is completed, in operation S430, the non-volatile memory device 100 may experience the SMT process. The first threshold voltage distribution may be changed by the SMT process. In other words, the non-volatile memory device 100 may suffer the high-temperature degradation due to the SMT process.

In operation S440, the non-volatile memory device 100 that experiences the SMT process may perform the migration operation. The migration operation may include operation S441, operation S442, and operation S443. In operation S441, the non-volatile memory device 100 may perform the first read operation based on the first read level set. In operation S442, the non-volatile memory device 100 may perform the normal program operation based on the second verify voltage set.

In operation S443, the non-volatile memory device 100 may perform a second flag marking operation. The non-volatile memory device 100 may mark a flag of a given value on memory blocks in which the normal program operation is completed. For example, the non-volatile memory device 100 may mark a flag of "0" on memory blocks in which the normal program operation is completed.

In operation S445, the non-volatile memory device 100 may determine whether the marked flag corresponds to a given value. For example, when the given value is "1" and the marked flag is "1", operation S441 may be performed. When the given value is "1" and the marked flag is not "1", operation S450 may be performed.

The non-volatile memory device 100 may include a plurality of memory blocks, and the plurality of memory blocks may include a first memory block and a second memory block. The first memory block may include at least one memory cell forming the first threshold voltage distribution experiencing the high-temperature degradation in the SMT process. The second memory block may include only memory cells forming the second threshold voltage distribution not experiencing the high-temperature degradation after the migration operation is completed.

As the non-volatile memory device 100 experiences the SMT process and performs the migration operation, the first memory block and the second memory block may be present together. The non-volatile memory device 100 may increase the reliability of data by performing the first read operation on the first memory block and performing the second read operation on the second memory block.

In operation S450, the non-volatile memory device 100 may perform the second read operation in response to the second read level set. According to an embodiment, magnitudes of read voltages included in the second level voltage set may be larger than magnitudes of read voltages included in the first read level set.

Because read voltages of the first read operation for minimizing error bits are different from read voltages of the second read operation for minimizing error bits, an efficient management operation is required with regard to the setting of read voltages necessary for each read operation. The non-volatile memory device 100 may efficiently manage the read operation by differently controlling a read time or a read voltage magnitude based on a flag.

FIGS. 18A and 18B illustrate examples of flags marked according to operation S445 of FIG. 17. FIG. 18A shows a 1-bit flag table, and FIG. 18B shows a 2-bit flag table. Flag information may be stored in the memory controller 200 in the form of a table.

Referring to FIGS. 17 and 18A, a flag may be composed of one bit. An initial state of the flag may be "0". The non-volatile memory device 100 may perform the initial program operation in response to the program command P_CMD in the SMT mode. The non-volatile memory device 100 check a program pass/fail through the first verify voltage set and may complete the initial program operation when memory cells form the first threshold voltage distribution.

When the initial program operation for a target memory block is completed, the non-volatile memory device 100 may store the corresponding information as flag information in the memory controller 200. For example, the memory controller 200 may mark a flag with "1" in response to a signal indicating that the initial program operation (e.g., Pre-PGM) is completed. In this case, according to operation S445 of FIG. 17, the given value may be "1". Afterwards, a threshold voltage distribution of the non-volatile memory device 100 may be degraded due to a high temperature in the SMT process, and the flag may be maintained at "1".

The non-volatile memory device 100 may perform the migration operation in the normal mode. The migration operation may include the first read operation and the normal program operation, and the non-volatile memory device 100 may perform the first read operation on a memory block whose flag is "1", based on the first read level set. In other words, the non-volatile memory device 100 may receive information about a flag of a target memory block from the memory controller 200, and when the flag of the target memory block is "1", the non-volatile memory device 100 may perform the first read operation.

The non-volatile memory device 100 may perform the normal program operation in response to the program command P_CMD in the normal mode. The non-volatile memory device 100 check a program pass/fail through the second verify voltage set and may complete the normal program operation when memory cells form the second threshold voltage distribution.

When the normal program operation for a target memory block is completed, the non-volatile memory device 100 may store the corresponding information as flag information in the memory controller 200. For example, the memory controller 200 may mark a flag with "0" in response to a signal indicating that the normal program operation is completed.

The non-volatile memory device 100 may perform the second read operation on a memory block whose flag is "0", based on the second read level set. In other words, the non-volatile memory device 100 may receive information about a flag of a target memory block from the memory controller 200, and when the flag of the target memory block is "0", the non-volatile memory device 100 may perform the second read operation.

According to an embodiment, a table may be composed of a plurality of bits. For example, the table may be composed of two bits. Referring to FIG. 18B, a flag of an initial state may be "00". A first bit of the flag may relate to the initial program operation, and a second bit of the flag may relate to the normal program operation.

After the initial program operation, the first bit may be marked with "1". The first bit may maintain "1" even after the SMT process and the migration operation. After the migration operation, the second bit may be marked with "1". In this case, according to operation S445 of FIG. 17, the given value may be "10".

In other words, the non-volatile memory device 100 may perform the first read operation on a memory block whose flag is "10", based on the first read level set. The non-volatile memory device 100 may perform the second read operation on a memory block whose flag is "11", based on the second read level set.

According to an embodiment, the flag information may be stored and managed in the SRAM 220 of the memory controller 200, but the present disclosure is not limited thereto. For example, the flag information may be stored in an arbitrary nonvolatile memory of a plurality of nonvolatile memories. The non-volatile memory device 100 may efficiently manage the read level sets of the first read operation and the second read operation by managing, as a flag, information about whether the initial program operation is completed and whether the normal program operation is completed.

Figure 19:
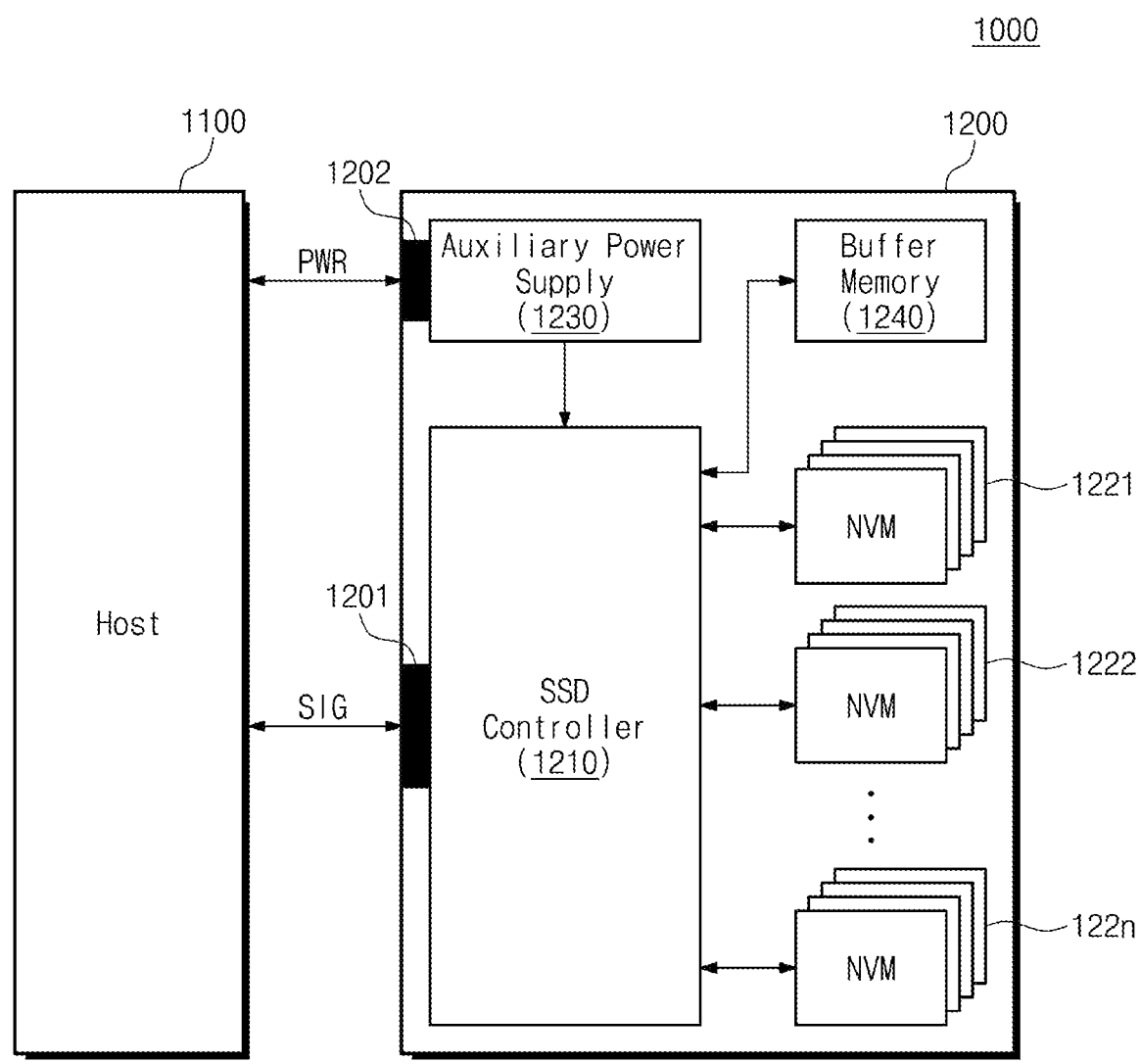
FIG. 19 is a block diagram illustrating a solid state drive system (SSD) to which a non-volatile memory device according to an embodiment of the present disclosure is applied.

FIG. 19 is a block diagram illustrating a solid state drive system (SSD) to which a non-volatile memory device according to an embodiment of the present disclosure is applied.

Referring to FIG. 19, an SSD system 1000 may include a host 1100 and a storage device 1200. For example, the SSD system 1000 may be a computing system, which is configured to process a variety of information, such as a personal computer (PC), a notebook, a laptop, a server, a workstation, a tablet PC, a smartphone, a digital camera, and a black box.

The host 1100 may control an overall operation of the SSD system 1000. For example, the host 1100 may store data in the storage device 1200 or may read data stored in the storage device 1200. The storage device 1200 may exchange signals SIG with the host 1100 through a signal connector 1201 and may be supplied with a power PWR through a power connector 1202. The storage device 1200 may include an SSD controller 1210, a plurality of nonvolatile memories 1221 to 122n, an auxiliary power supply 1230, and a buffer memory 1240.

The SSD controller 1210 may control the plurality of nonvolatile memories 1221 to 122n in response to the signals SIG received from the host 1100. The plurality of nonvolatile memories 1221 to 122n may operate under control of the SSD controller 1210.

According to an embodiment, the SSD controller 1210 may include a reliability manager for guaranteeing the reliability of data stored in the plurality of nonvolatile memories 1221 to 122n. For example, data stored in the plurality of nonvolatile memories 1221 to 122n may include an error due to various factors. The error may be detected or corrected through a separate error correction means (e.g., an ECC engine). In this case, when the error exceeds an error correction level correctable by the separate error correction means, the reliability of data stored in the plurality of nonvolatile memories 1221 to 122n may not be guaranteed. In other words, the data stored in the plurality of nonvolatile memories 1221 to 122n may be lost.

Each of the plurality of nonvolatile memories 1221 to 122n may include the non-volatile memory device described with reference to FIGS. 1 to 18B. Each of the plurality of nonvolatile memories 1221 to 122n may guarantee the reliability of data by performing different program operations and different read operations before and after the SMT process based on the methods described with reference to FIGS. 1 to 18B.

Figure 20:
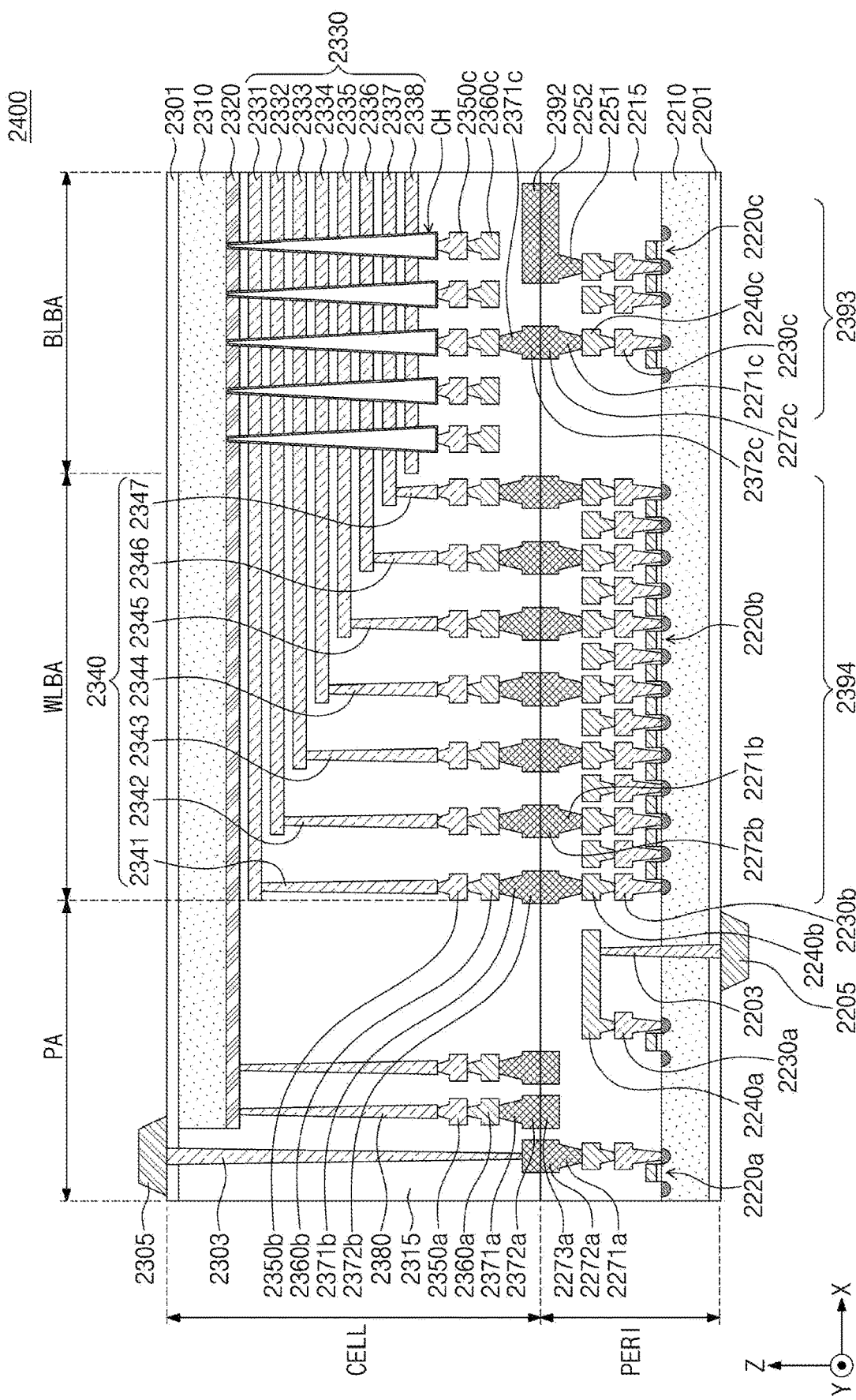
FIG. 20 is a diagram illustrating a memory device according to an embodiment of the present disclosure.

FIG. 20 is a diagram illustrating a memory device 2400 according to embodiment of present disclosure.

Referring to FIG. 20, a memory device 2400 may have a chip-to-chip (C2C) structure. The C2C structure may refer to a structure formed by manufacturing an upper chip including a cell region CELL on a first wafer, manufacturing a lower chip including a peripheral circuit region PERI on a second wafer, separate from the first wafer, and then bonding the upper chip and the lower chip to each other. Here, the bonding process may include a method of electrically connecting a bonding metal formed on an uppermost metal layer of the upper chip and a bonding metal formed on an uppermost metal layer of the lower chip. For example, when the bonding metals may include copper (Cu), a Cu-to-Cu bonding process may be employed. The example embodiment, however, may not be limited thereto. For example, the bonding metals may also be formed of aluminum (Al) or tungsten (W).

Each of the peripheral circuit region PERI and the cell region CELL of the memory device 2400 may include an external pad bonding area PA, a word line bonding area WLBA, and a bit line bonding area BLBA.

The peripheral circuit region PERI may include a first substrate 2210, an interlayer insulating layer 2215, a plurality of circuit elements 2220a, 2220b, and 2220c formed on the first substrate 2210, first metal layers 2230a, 2230b, and 2230c respectively connected to the plurality of circuit elements 2220a, 2220b, and 2220c, and second metal layers 2240a, 2240b, and 2240c formed on the first metal layers 2230a, 2230b, and 2230c. In an example embodiment, the first metal layers 2230a, 2230b, and 2230c may be formed of tungsten having relatively high electrical resistivity, and the second metal layers 2240a, 2240b, and 2240c may be formed of copper having relatively low electrical resistivity.

In an example embodiment illustrate in FIG. 20, although only the first metal layers 2230a, 2230b, and 2230c and the second metal layers 2240a, 2240b, and 2240c are shown and described, the example embodiment is not limited thereto, and at least one or more additional metal layers may be further formed on the second metal layers 2240a, 2240b, and 2240c. At least a portion of the one or more additional metal layers formed on the second metal layers 2240a, 2240b, and 2240c may be formed of aluminum or the like having a lower electrical resistivity than those of copper forming the second metal layers 2240a, 2240b, and 2240c.

The interlayer insulating layer 2215 may be disposed on the first substrate 2210 and cover the plurality of circuit elements 2220a, 2220b, and 2220c, the first metal layers 2230a, 2230b, and 2230c, and the second metal layers 2240a, 2240b, and 2240c. The interlayer insulating layer 2215 may include an insulating material such as silicon oxide, silicon nitride, or the like.

Lower bonding metals 2271b and 2272b may be formed on the second metal layer 2240b in the word line bonding area WLBA. In the word line bonding area WLBA, the lower bonding metals 2271b and 2272b in the peripheral circuit region PERI may be electrically bonded to upper bonding metals 2371b and 2372b of the cell region CELL. The lower bonding metals 2271b and 2272b and the upper bonding metals 2371b and 2372b may be formed of aluminum, copper, tungsten, or the like. In an example embodiment, lower bonding metals 2271a and 2272a in the peripheral circuit region PERI may be formed on the second metal layer (not illustrated).

Further, the upper bonding metals 2371b and 2372b in the cell region CELL may be referred as first metal pads and the lower bonding metals 2271b and 2272b in the peripheral circuit region PERI may be referred as second metal pads.

The cell region CELL may include at least one memory block. The cell region CELL may include a second substrate 2310, interlayer insulating film 2315, and a common source line 2320. On the second substrate 2310, a plurality of word lines 2331, 2332, 2333, 2334, 2335, 2336, 2337 and 2338 (e.g., 2330) may be stacked in a direction (a Z-axis direction), perpendicular to an upper surface of the second substrate 2310. At least one string select line and at least one ground select line may be arranged on and below the plurality of word lines 2330, respectively, and the plurality of word lines 2330 may be disposed between the at least one string select line and the at least one ground select line.

Widths along the X-direction of the word lines 2330 may be different. As the distance from the first substrate 2210 in the peripheral circuit region PERI to the corresponding one of the plurality of word lines 2330 increases, the width of the corresponding one of the plurality of word lines 2330 decreases. Likewise, as the distance from the second substrate 2310 of the cell region CELL to the corresponding one of the plurality of word lines 2330 increases, the width of the corresponding one of the plurality of word lines 2330 increases.

In the bit line bonding area BLBA, a channel structure CH may extend in a direction (a Z-axis direction), perpendicular to the upper surface of the second substrate 2310, and pass through the plurality of word lines 2330, the at least one string select line, and the at least one ground select line. The channel structure CH may include a data storage layer, a channel layer, a buried insulating layer, and the like, and the channel layer may be electrically connected to a first metal layer 2350c and a second metal layer 2360c. For example, the first metal layer 2350c may be a bit line contact, and the second metal layer 2360c may be a bit line. In an example embodiment, the second metal layer (e.g., bit line) 2360c may extend in a first direction (a Y-axis direction), parallel to the upper surface of the second substrate 2310.

The interlayer insulating layer 2315 is disposed on the second substrate 2310 to cover the common source line 2320, the plurality of word lines 2330, a plurality of cell contact plugs 2340, first metal layers 2350a, 2350b, and 2350c, and a second metal layers 2360a, 2360b, and 2360c, and may include an insulating material such as silicon oxide or silicon nitride.

In an example embodiment illustrated in FIG. 20, an area in which the channel structure CH, the second metal layer (e.g., the bit line) 2360c, and the like are disposed may be the bit line bonding area BLBA. In the bit line bonding area BLBA, the second metal layer (e.g., the bit line) 2360c may be electrically connected to the circuit elements 2220c providing a page buffer 2393 in the peripheral circuit region PERI. The second metal layer (e.g., the bit line) 2360c may be connected to upper bonding metals 2371c and 2372c in the cell region CELL, and the upper bonding metals 2371c and 2372c may be connected to lower bonding metals 2271c and 2272c connected to the circuit elements 2220c of the page buffer 2393.

In the word line bonding area WLBA, the plurality of word lines 2330 may extend in a second direction (an X-axis direction), parallel to the upper surface of the second substrate 2310 and perpendicular to the first direction, and may be connected to a plurality of cell contact plugs 2341, 2342, 2343, 2344, 2345, 2346 and 2347 (e.g., 2340). The plurality of word lines 2330 and the plurality of cell contact plugs 2340 may be connected to each other in pads provided by at least a portion of the plurality of word lines 2330 extending in different lengths in the second direction. The first metal layer 2350b and the second metal layer 2360b may be connected to an upper portion of the plurality of cell contact plugs 2340 connected to the plurality of word lines 2330, sequentially. The plurality of cell contact plugs 2340 may be connected to the peripheral circuit region PERI by the upper bonding metals 2371b and 2372b of the cell region CELL and the lower bonding metals 2271b and 2272b of the peripheral circuit region PERI in the word line bonding area WLBA.

The plurality of cell contact plugs 2340 may be electrically connected to the circuit elements 2220b forming a row decoder 2394 in the peripheral circuit region PERI. In an example embodiment, operating voltages of the circuit elements 2220b of the row decoder 2394 may be different than operating voltages of the circuit elements 2220c forming the page buffer 2393. For example, operating voltages of the circuit elements 2220c forming the page buffer 2393 may be greater than operating voltages of the circuit elements 2220b forming the row decoder 2394.

A common source line contact plug 2380 may be disposed in the external pad bonding area PA. The common source line contact plug 2380 may be formed of a conductive material such as a metal, a metal compound, polysilicon, or the like, and may be electrically connected to the common source line 2320. The first metal layer 2350a and the second metal layer 2360a may be stacked on an upper portion of the common source line contact plug 2380, sequentially. For example, an area in which the common source line contact plug 2380, the first metal layer 2350a, and the second metal layer 2360a are disposed may be the external pad bonding area PA. In an example embodiment, in the external pad bonding area. PA, an upper metal pattern 2371a is formed in the cell region CELL in a direction opposite to the direction from an upper metal pattern 2372a.

Input-output pads 2205 and 2305 may be disposed in the external pad bonding area PA. Referring to FIG. 20, a lower insulating film 2201 covering a lower surface of the first substrate 2210 may be formed below the first substrate 2210, and a first input-output pad 2205 may be formed on the lower insulating film 2201. The first input-output pad 2205 may be connected to at least one of the plurality of circuit elements 2220a, 2220b, and 2220c disposed in the peripheral circuit region PERI through a first input-output contact plug 2203, and may be separated from the first substrate 2210 by the lower insulating film 2201. In addition, a side insulating film may be disposed between the first input-output contact plug 2203 and the first substrate 2210 to electrically separate the first input-output contact plug 2203 and the first substrate 2210.

Referring to FIG. 20, an upper insulating film 2301 covering the upper surface of the second substrate 2310 may be formed on the second substrate 2310, and a second input-output pad 2305 may be disposed on the upper insulating layer 2301. The second input-output pad 2305 may be connected to at least one of the plurality of circuit elements 2220a, 2220b, and 2220c disposed in the peripheral circuit region PERI through a second input-output contact plug 2303. In the example embodiment, the second input-output pad 2305 is electrically connected to a circuit element 2220a.

According to embodiments, the second substrate 2310 and the common source line 2320 may not be disposed in an area in which the second input-output contact plug 2303 is disposed. In addition, the second input-output pad 2305 may not overlap the word lines 2330 in the third direction (the Z-axis direction). Referring to FIG. 20, the second input-output contact plug 2303 may be separated from the second substrate 2310 in a direction, parallel to the upper surface of the second substrate 2310, and may pass through the interlayer insulating layer 2315 of the cell region CELL to be connected to the second input-output pad 2305.

According to embodiments, the first input-output pad 2205 and the second input-output pad 2305 may be selectively formed. For example, the memory device 2400 may include only the first input-output pad 2205 disposed on the first substrate 2210 or the second input-output pad 2305 disposed on the second substrate 2310. Alternatively, the memory device 2400 may include both the first input-output pad 2205 and the second input-output pad 2305.

A metal pattern provided on an uppermost metal layer of the structure shown in FIG. 20 may be provided as a dummy pattern or the uppermost metal layer may be absent, in each of the external pad bonding area PA and the bit line bonding area BLBA, respectively included in the cell region CELL and the peripheral circuit region PERI.

In the external pad bonding area PA, the memory device 2400 may include a lower metal pattern 2273a, corresponding to an upper metal pattern 2372a formed in an uppermost metal layer of the cell region CELL, and having the same cross-sectional shape as the upper metal pattern 2372a of the cell region CELL so as to be connected to each other, in an uppermost metal layer of the peripheral circuit region PERI. In the peripheral circuit region PERI, the lower metal pattern 2273a formed in the uppermost metal layer of the peripheral circuit region PERI may not be connected to a contact. Similarly, in the external pad bonding area PA, the upper metal pattern 2372a, corresponding to the lower metal pattern 2273a formed in an uppermost metal layer of the peripheral circuit region PERI, and having the same shape as the lower metal pattern 2273a of the peripheral circuit region PERI, may be formed in an uppermost metal layer of the cell region CELL.

The lower bonding metals 2271b and 2272b may be formed on the second metal layer 2240b in the word line bonding area WLBA. In the word line bonding area WLBA, the lower bonding metals 2271b and 2272b of the peripheral circuit region PERI may be electrically connected to the upper bonding metals 2371b and 2372b of the cell region CELL by a Cu-to-Cu bonding.

Further, in the bit line bonding area BLBA, an upper metal pattern 2392, corresponding to a lower metal pattern 2252 formed in the uppermost metal layer of the peripheral circuit region PERI, and having the same cross-sectional shape as the lower metal pattern 2252 of the peripheral circuit region PERI, may be formed in an uppermost metal layer of the cell region CELL. A contact may not be formed on the upper metal pattern 2392 formed in the uppermost metal layer of the cell region CELL. In an example embodiment, a lower metal pattern 2251 is formed in the uppermost metal layer of the peripheral circuit region PERI in a direction opposite to the direction from the lower metal pattern 2252.

In an example embodiment, corresponding to a metal pattern formed in an uppermost metal layer in one of the cell region CELL and the peripheral circuit region PERI, a reinforcement metal pattern having the same cross-sectional shape as the metal pattern may be formed in an uppermost metal layer in the other one of the cell region CELL and the peripheral circuit region PERI. A contact may not be formed on the reinforcement metal pattern.

According to an embodiment, the memory cell array or the memory block described with reference to FIGS. 1 to 18B may be included in the memory cell region CELL of FIG. 20. The peripheral circuits (e.g., a row decoder, a page buffer circuit, an input/output circuit, and a control logic circuit) described with reference to FIGS. 1 to 18B may be included in the peripheral circuit region PERI.

A non-volatile memory device according to an embodiment of the present disclosure may guarantee a threshold voltage margin of a given value or more by repeatedly performing initial program operations before the SMT process. As such, the high-temperature degradation of memory cells according to the SMT process may be prevented by increasing read performance, and the SIM process may be applicable to triple level cells.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. An operating method of a non-volatile memory device, the method comprising:
   receiving a program command from an external device;
   determining an operating mode in response to the program command;
   when the operating mode is a surface mount technology (SMT) mode, performing an initial program operation in which a plurality of memory cells are programmed through a plurality of steps to form a first threshold voltage distribution; and
   when the operating mode is a normal mode, performing a normal program operation in which the plurality of memory cells are programmed through a single step to form a second threshold voltage distribution,
   wherein the first threshold voltage distribution is narrower in width than the second threshold voltage distribution,
   wherein the performing of the initial program operation includes:
   performing a 1-step initial program operation in which memory cells selected from the plurality of memory cells are programmed based on first initial program voltages and first initial verify voltages; and
   performing a 2-step initial program operation in which the selected memory cells are programmed based on second initial program voltages and second initial verify voltages to form the first threshold voltage distribution,
   wherein the performing of the initial program operation further includes:
   determining whether a word line of an erase state is present in a selected memory block;
   when the word line of the erase state is present in the selected memory block, programming dummy data in memory cells associated with the word line of the erase state; and
   when the word line of the erase state is absent from the selected memory block, completing the initial program operation.

2. The method of claim 1, wherein the plurality of memory cells targeted for the initial program operation and the normal program operation store the same number of bits.

3. The method of claim 1, wherein the 1-step initial program operation and the 2-step initial program operation are performed in an incremental step programming (ISPP) technique.

4. The method of claim 3, wherein an increment of the first initial program voltages applied to a selected word line in the 1-step initial program operation is greater than an increment of the second initial program voltages applied to the selected word line in the 2-step initial program operation.

5. The method of claim 3, wherein a magnitude of each of the second initial verify voltages is greater than a magnitude of its corresponding one of the first initial verify voltages.

6. An operating method of a non-volatile memory device, the method comprising:
   receiving a read command from an external device;
   determining an operating mode in response to the read command;
   when the operating mode is a surface mount technology (SMT) mode, performing a first read operation based on a first read level set; and
   when the operating mode is a normal mode, performing a second read operation based on a second read level set, wherein the first read level set is used to read a first threshold voltage distribution of memory cells programmed in the SMT mode, wherein the second read level set is used to read a second threshold voltage distribution of memory cells programmed in the normal mode, wherein the first threshold voltage distribution is narrower in width to mitigate high-temperature effects during the SMT process compared to the second threshold voltage distribution.

7. The method of claim 6, wherein the first read level set includes first read voltages, wherein the second read level set includes second read voltages, and wherein a magnitude of each of the first read voltages is different from a magnitude of its correspond one of the second read voltages.

8. The method of claim 7, wherein the magnitude of each of the second read voltages is larger than the magnitude of its corresponding one of the first read voltages.

9. The method of claim 6, wherein the first read level set includes first read times, wherein the second read level set includes second read times, and wherein each of the first read times is different from its corresponding one of the second read times.

10. The method of claim 9, wherein each of the first read times is greater than its corresponding one of the second read times.

11. An operating method of a non-volatile memory device, the method comprising:

performing an initial program operation in which a plurality of memory cells are programmed based on a program command through a plurality steps to form a first threshold voltage distribution, in a surface mount technology (SMT) mode;

performing a first read operation in which data programmed in the plurality of memory cells after a surface mount technology is applied are read based on a first read level set, in the SMT mode;

performing a normal program operation in which the plurality of memory cells on which the first read operation is completely performed are programmed based on the program command to form a second threshold voltage distribution, in a normal mode; and performing a second read operation in which data programmed in the plurality of memory cells are read based on a second read level set different from the first read level set, in the normal mode, wherein the first threshold voltage distribution is narrower in width than the second threshold voltage distribution, wherein the performing of the initial program operation further includes:

determining whether a word line of an erase state is present in a selected memory block;

when the word line of the erase state is present in the selected memory block, programming dummy data in memory cells associated with the word line of the erase state; and when the word line of the erase state is absent from the selected memory block, completing the initial program operation.

12. The method of claim 11, wherein the plurality of memory cells targeted for the initial program operation and the normal program operation store the same number of bits.

13. The method of claim 11, wherein the performing of the initial program operation further includes:

performing a 1-step initial program operation in which memory cells selected from the plurality of memory cells are programmed based on first initial program voltages and first initial verify voltages; and performing a 2-step initial program operation in which the selected memory cells are programmed based on second initial program voltages and second initial verify voltages to form the first threshold voltage distribution.

14. The method of claim 13, wherein the 1-step initial program operation and the 2-step initial program operation are performed in an incremental step programming (ISPP) manner.

15. The method of claim 14, wherein an increment of the first initial program voltages applied to a selected word line in the 1-step initial program operation is greater than an increment of the second initial program voltages applied to the selected word line in the 2-step initial program operation.

16. The method of claim 14, wherein a magnitude of each of the second initial verify voltages is greater than a magnitude of its corresponding one of the first initial verify voltages.

17. The method of claim 11, wherein the first read level set includes first read voltages, wherein the second read level set includes second read voltages, and wherein a magnitude of each of the second read voltages is larger than a magnitude of its corresponding one of the first read voltages.

18. The method of claim 11, wherein the first read operation and the second read operation are performed based on a flag, the method further comprising:

when a read command is received, determining the flag;

when the flag is a predetermined value, performing the first read operation based on the first read level set, and when the flag is not the predetermined value, performing the second read operation based on the second read level set.

* * * * *